(12) United States Patent
Naito

(10) Patent No.: US 10,510,832 B2
(45) Date of Patent: Dec. 17, 2019

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/015,201

(22) Filed: Jun. 22, 2018

(65) Prior Publication Data

US 2019/0019861 A1 Jan. 17, 2019

(30) Foreign Application Priority Data

Jul. 14, 2017 (JP) ................................. 2017-138462
Sep. 15, 2017 (JP) ................................. 2017-177941

(51) Int. Cl.
*H01L 29/06* (2006.01)
*H01L 29/08* (2006.01)
(Continued)

(52) U.S. Cl.
CPC .... *H01L 29/0634* (2013.01); *H01L 21/28114* (2013.01); *H01L 27/0629* (2013.01);
(Continued)

(58) Field of Classification Search
CPC ............... H01L 29/0634; H01L 29/861; H01L 27/0629; H01L 29/8613; H01L 27/0664; H01L 29/4236; H01L 29/401; H01L 29/7397; H01L 29/42368; H01L 29/42376; H01L 29/1095; H01L 29/0834; H01L 29/0638; H01L 29/0696; H01L 21/28114; H01L 29/407; H01L 29/0692; H01L 29/0623
(Continued)

(56) References Cited

U.S. PATENT DOCUMENTS

2012/0146091 A1  6/2012  Tanabe et al.
2012/0181575 A1  7/2012  Pfirsch
(Continued)

FOREIGN PATENT DOCUMENTS

JP  H08274301 A  10/1996
JP  2012138567 A  7/2012
(Continued)

*Primary Examiner* — Caleen O Sullivan

(57) ABSTRACT

A semiconductor device including: a drift region formed on a semiconductor substrate; a gate trench portion provided on an upper surface of the semiconductor substrate; a first and second mesa portion adjacent to one and the other of the gate trench portions; an accumulation region provided above the drift region in the first mesa portion; a base region provided above the accumulation region; a emitter region provided between the base region and the upper surface of the semiconductor substrate; an intermediate region provided above the drift region in the second mesa portion; a contact region provided above the intermediate region, wherein the gate trench portion has a gate conductive portion; a bottom portion of the gate conductive portion has a first step and second step; and, at least part of the intermediate region is provided between the steps and the bottom portion of the gate trench portion will be provided.

26 Claims, 25 Drawing Sheets

(51) Int. Cl.
  *H01L 27/06* (2006.01)
  *H01L 29/10* (2006.01)
  *H01L 29/423* (2006.01)
  *H01L 29/861* (2006.01)
  *H01L 29/739* (2006.01)
  *H01L 29/40* (2006.01)
  *H01L 21/28* (2006.01)

(52) U.S. Cl.
  CPC ...... *H01L 27/0664* (2013.01); *H01L 29/0638* (2013.01); *H01L 29/0696* (2013.01); *H01L 29/0834* (2013.01); *H01L 29/1095* (2013.01); *H01L 29/401* (2013.01); *H01L 29/4236* (2013.01); *H01L 29/42368* (2013.01); *H01L 29/42376* (2013.01); *H01L 29/7397* (2013.01); *H01L 29/861* (2013.01); *H01L 29/8613* (2013.01); *H01L 29/0623* (2013.01); *H01L 29/0692* (2013.01); *H01L 29/407* (2013.01)

(58) Field of Classification Search
  USPC .......................................................... 257/140
  See application file for complete search history.

(56) References Cited

U.S. PATENT DOCUMENTS

| | | | |
|---|---|---|---|
| 2016/0079235 A1* | 3/2016 | Matsudai | H01L 27/0727 |
| | | | 257/140 |
| 2017/0162563 A1 | 6/2017 | Kameyama et al. | |
| 2018/0019331 A1 | 1/2018 | Sumitomo et al. | |
| 2019/0148364 A1* | 5/2019 | Kono | H01L 29/739 |
| | | | 257/140 |

FOREIGN PATENT DOCUMENTS

| | | |
|---|---|---|
| JP | 2012151470 A | 8/2012 |
| JP | 2016039215 A | 3/2016 |
| JP | 2016157934 A | 9/2016 |

\* cited by examiner

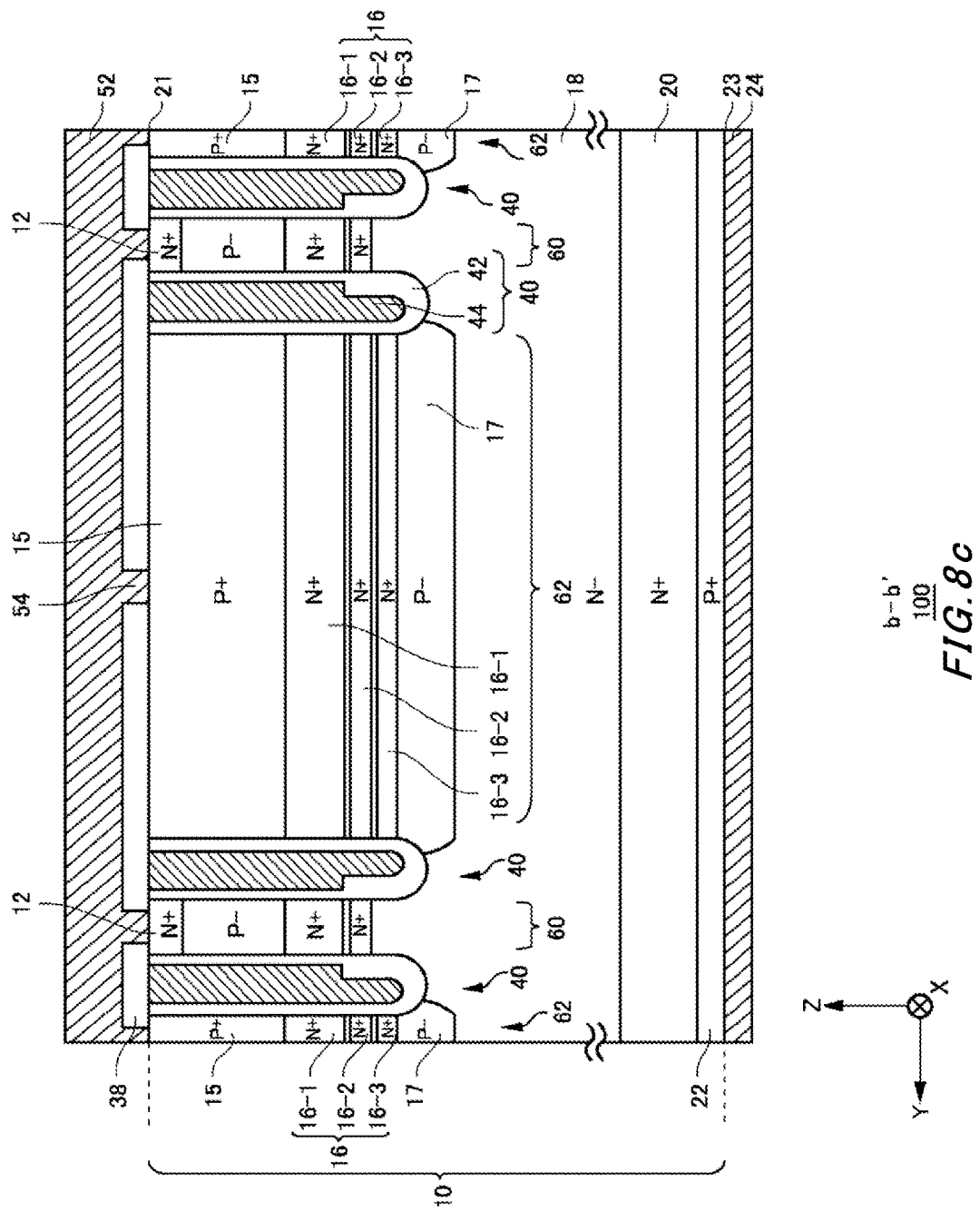

SEMICONDUCTOR DEVICE

The contents of the following Japanese patent application(s) are incorporated herein by reference:
NO. 2017-138462 filed in JP on Jul. 14, 2017,
NO. 2017-177941 filed in JP on Sep. 15, 2017.

BACKGROUND

1. Technical Field

The present invention relates to a semiconductor device.

2. Related Art

Conventionally, semiconductor devices such as insulated gate bipolar transistor (IGBT) are known (refer to the patent documents 1 and 2, for example). Patent Document 1: Japanese Patent Application Publication No. 2012-138567. Patent Document 2: Japanese Patent Application Publication No. 8-274301.

In semiconductor devices, it is desirable that characteristics such as turn-on loss are improved.

SUMMARY

A first aspect of the present invention provides a semiconductor device including a semiconductor substrate having a drift region of first conductivity type. The semiconductor device is provided from an upper surface of the semiconductor substrate to a drift region, and may include a gate trench portion which is arranged on the upper surface of the semiconductor substrate extending to a predetermined extending direction. The semiconductor device may include a first mesa portion which is provided adjacent to the gate trench portion in one of directions that are perpendicular to the extending direction of the semiconductor substrate. The semiconductor device may include a second mesa portion which is provided adjacent to the gate trench portion in the other one of the directions that are perpendicular to an extending direction of the semiconductor substrate. The semiconductor device is provided, in the first mesa portion, adjacent to the gate trench portion and above the drift region, and may include an accumulation region of the first conductivity type having higher doping concentration than that of the drift region. The semiconductor device may include, in the first mesa portion, a base region of second conductivity type provided adjacent to the gate trench portion and above the accumulation region. The semiconductor device is provided, in the first mesa portion, adjacent to the gate trench portion and between the base region and the upper surface of the semiconductor substrate, and may include an emitter region of the first conductivity type having higher doping concentration than that of the drift region. The semiconductor device may include, in the second mesa portion, an intermediate region of the second conductivity type provided adjacent to the gate trench portion and above the drift region. The semiconductor device may include, on an upper surface of the second mesa portion, a contact region of the second conductivity type provided adjacent to the gate trench portion and above the intermediate region. The gate trench portion may have a gate trench, a gate-insulating film which is formed covering an inner wall of the gate trench, and a gate conductive portion which is formed more inward than the gate-insulating film within the gate trench. A bottom portion of the gate conductive portion may have a first step on a side facing the first mesa portion. The bottom portion of the gate conductive portion may have, on a side facing the second mesa portion, a second step which has a smaller width than a width of the first step in a perpendicular direction to the extending direction, or may not have the second step. At least part of the intermediate region may be provided between the first step and the bottom portion of the gate trench portion in a depth direction of the semiconductor substrate.

An end of the bottom portion of the gate conductive portion may be provided closer to the second mesa portion than the center of the gate trench portion in the perpendicular direction to the predetermined extending direction on the upper surface of the semiconductor substrate. Above the first step, a thickness of the gate-insulating film on a side facing the first mesa portion may be different from a thickness of the gate-insulating film on a side facing the second mesa portion. A thickness of the gate-insulating film on a side facing the second mesa portion may be greater than a thickness of the gate-insulating film on a side facing the first mesa portion.

The intermediate region may cover at least part of the bottom portion of the gate trench portion. In the second mesa portion, the accumulation region of the first conductivity type having higher doping concentration than the drift region may be provided above the intermediate region and below the contact region. In the second mesa portion, the accumulation region may be provided contacting with the gate trench portion. In the second mesa portion, the accumulation region may be provided spaced apart from the gate trench portion. In the second mesa portion, an opening may be provided in the accumulation region.

In the second mesa portion, the accumulation region may have a first accumulation region, and a second accumulation region provided below the first accumulation region and above the intermediate region. In the second mesa portion, the first accumulation region has a first opening, and the second accumulation region has a second opening, where the first opening and the second opening may be different in positions in the depth direction of the semiconductor substrate.

In the first mesa portion, the accumulation region may have N accumulation regions in the depth direction of the semiconductor substrate. In the second mesa portion, the accumulation region may have M accumulation regions in the depth direction of the semiconductor substrate. Here, N and M may satisfy the relationship: N<M.

The intermediate region may be provided below the contact region, contacting with the contact region. The doping concentration may smoothly change across a region from the contact region to the intermediate region. The intermediate region may have the peak of the doping concentration in the depth direction of the semiconductor substrate. A peak of the doping concentration of the intermediate region may exist, in the depth direction of the semiconductor substrate, within an area from the first step to the end of the bottom portion of the gate trench portion. A peak of the doping concentration of the intermediate region may exist, in the depth direction of the semiconductor substrate, below half the depth, which is the depth from the first step to the end of the bottom portion of the gate trench portion.

A plurality of gate trench portions may be provided next to each other with the second mesa portion therebetween. Between the plurality of gate trench portions that are next to each other, a dummy trench portion may not be provided.

A mesa width of the second mesa portion may be greater than a mesa width of the first mesa portion. The mesa width of the first mesa portion may be smaller than the depth from the upper surface of the semiconductor substrate to the end of the bottom portion of the gate trench portion.

The semiconductor device may further include an interlayer dielectric film formed on the semiconductor substrate. The interlayer dielectric film may have a contact hole. A plurality of contact holes may be provided above the second mesa portion.

Doping concentrations of the contact region and the intermediate region may be higher than doping concentration of the base region. The doping concentration of the contact region may be equal to the doping concentration of the base region.

A second aspect of the present invention provides a semiconductor device including a semiconductor substrate having a drift region of the first conductivity type. The semiconductor device is provided from an upper surface of the semiconductor substrate to a drift region, and may include a dummy trench portion which is arranged on an upper surface of the semiconductor substrate extending to a predetermined extending direction. The semiconductor device may include a diode mesa portion which is provided adjacent to the dummy trench portion in the direction perpendicular to the extending direction of the semiconductor substrate. The semiconductor device is provided, in the diode mesa portion, adjacent to the dummy trench portion and above the drift region, and may include an accumulation region of the first conductivity type having higher doping concentration than that of the drift region. The semiconductor device may include, in the diode mesa portion, a base region of the second conductivity type provided adjacent to the dummy trench portion and above the accumulation region. The semiconductor device is provided, in the diode mesa portion, between the base region and the upper surface of the semiconductor substrate, and may include an emitter region of the first conductivity type having higher doping concentration than that of the drift region. The semiconductor device may include, in the diode mesa portion, the contact region of the second conductivity type provided between the base region and the upper surface of the semiconductor substrate. The semiconductor device may include, in the diode mesa portion, an intermediate region of the second conductivity type provided adjacent to the gate trench portion and above the drift region.

A boundary between the emitter region and the contact region in the diode mesa portion may be parallel to the extending direction. The boundary between the emitter region and the contact region in the diode mesa portion may be perpendicular to the extending direction.

The dummy trench portion may have a dummy trench, a dummy insulating film formed covering an inner wall of the dummy trench, and a dummy conductive portion formed more inward than the dummy insulating film within the dummy trench. A bottom portion of the dummy conductive portion may have a third step on an opposite side to the diode mesa portion. The bottom portion of the dummy conductive portion may have a fourth step which is smaller than the third step, or may not have a fourth step, on a side facing the diode mesa portion. At least part of the intermediate region may be provided between the third step and the bottom portion of the dummy trench portion in the depth direction of the semiconductor substrate.

The summary clause does not necessarily describe all necessary features of the embodiments of the present invention. The present invention may also be a sub-combination of the features described above.

BRIEF DESCRIPTION OF THE DRAWINGS

FIG. 1b illustrates an exemplary a-a' cross-section in FIG. 1a.

FIG. 2b illustrates an exemplary g-g' cross-section in FIG. 2a.

FIG. 3b illustrates an exemplary h-h' cross-section in FIG. 3a.

FIG. 4a illustrates an exemplary b-b' cross-section in FIG. 1a.

FIG. 4b illustrates another exemplary b-b' cross-section in FIG. 1a.

FIG. 4c illustrates still another exemplary b-b' cross-section in FIG. 1a.

FIG. 5a is an enlarged view of a region A in FIG. 4a.

FIG. 5b illustrates an example where a second step 46-2 is additionally provided to the example shown in FIG. 5a.

FIG. 7 illustrates an exemplary profile of doping concentration in an e-e' cross-section and an f-f' cross-section in FIG. 5a.

FIG. 8a illustrates still another exemplary b-b' cross-section in FIG. 1a.

FIG. 8b illustrates still another exemplary b-b' cross-section in FIG. 1a.

FIG. 8c illustrates still another exemplary b-b' cross-section in FIG. 1a.

FIG. 9 illustrates still another exemplary b-b' cross-section in FIG. 1a.

FIG. 11 illustrates still another exemplary b-b' cross-section in FIG. 1a.

FIG. 12 illustrates still another exemplary b-b' cross-section in FIG. 1a.

FIG. 13 illustrates still another exemplary b-b' cross-section in FIG. 1a.

FIG. 14 illustrates still another exemplary b-b' cross-section in FIG. 1a.

FIG. 15 illustrates still another exemplary b-b' cross-section in FIG. 1a.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side in a direction parallel to a depth direction of a semiconductor substrate is referred to as "above", and the other side is referred to as "below". One of two principal surfaces of a substrate, a layer or some other member is referred to as an upper surface, and the other surface is referred to as a lower surface. The "above" and "below" directions are not limited by the direction of gravity or a direction of attachment to a substrate or the like at the time of implementation of a semiconductor device.

In the present specification, technical matters may be described using orthogonal coordinate axes of X-axis, Y-axis and Z-axis. In the present specification, a plane parallel to an upper surface of the semiconductor substrate is regarded as XY-plane, and the depth direction of the semiconductor substrate is regarded as the Z-axis.

Although in each example shown, the first conductivity type is N-type, and second conductivity type is P-type, the first conductivity type may be P-type, and the second conductivity type may be N-type. In this case, conductivity types of substrates, layers, regions and the like in each example have opposite polarities, respectively.

Figure 1A:
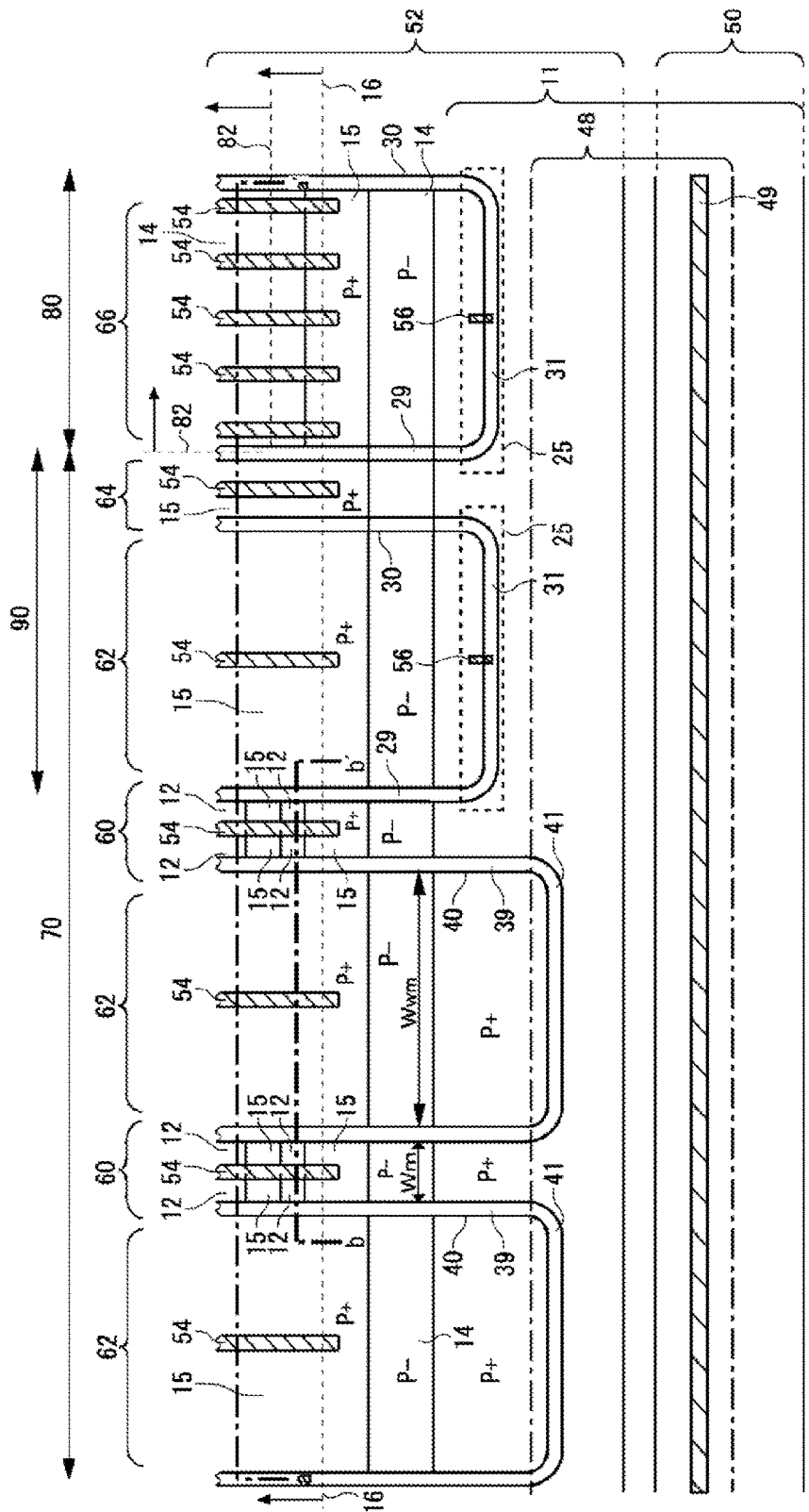
FIG. 1a partially illustrates an exemplary upper surface of a semiconductor device 100 according to the present embodiment.

FIG. 1a partially illustrates an exemplary upper surface of a semiconductor device 100 according to the present embodiment. The semiconductor device 100 in the present example is a semiconductor chip which includes a transistor portion 70 and a diode portion 80. The transistor portion 70 includes transistors such as IGBTs. The diode portion 80 is provided adjacent to the transistor portion 70 on an upper surface of a semiconductor substrate, and includes diodes such as FWDs (Free Wheel Diode). A boundary portion 90 is a region, in the transistor portion 70, which is next to the diode portion 80. In FIG. 1a shows a chip upper surface around a chip end portion and omits the other regions.

Also, FIG. 1a shows an active region of the semiconductor substrate in the semiconductor device 100, which may have an edge termination structure portion surrounding the active region. The active region refers to a region where current flows when the semiconductor device 100 is controlled in ON state. The edge termination structure portion relaxes electric field concentration on the upper surface side of the semiconductor substrate. The edge termination structure portion has, for example, a guard ring, a field plate, a resurf, and a structure of combination thereof.

The semiconductor device 100 in the present example includes gate trench portions 40, dummy trench portions 30, a well region 11, emitter regions 12, base regions 14, and contact regions 15, and they are provided inside the semiconductor substrate and exposed on the upper surface of the semiconductor substrate. Also, the semiconductor device 100 in the present example includes an emitter electrode 52 and a gate metal layer 50 which are provided above the upper surface of the semiconductor substrate. The emitter electrode 52 and the gate metal layer 50 are provided separately from each other.

An interlayer dielectric film is formed between the upper surface of the semiconductor substrate, and the emitter electrode 52 and the gate metal layer 50, but this is omitted in FIG. 1a. In the interlayer dielectric film in the present example, contact holes 56, contact holes 49 and contact holes 54 are formed penetrating the interlayer dielectric film.

Also, the emitter electrode 52 is connected to dummy conductive portions in the dummy trench portions 30 through the contact holes 56. Connection portions 25 which are formed of conductive material such as polysilicon or the like doped with impurities may be provided between the emitter electrode 52 and the dummy conductive portions. An insulating film such as an oxide film is formed between the connection portions 25 and the upper surface of the semiconductor substrate.

The gate metal layer 50 contacts with the gate runner 48 through the contact holes 49. The gate runner 48 is formed of polysilicon or the like doped with impurities. The gate runner 48 is connected to gate conductive portions in the gate trench portion 40 on the upper surface of the semiconductor substrate. The gate runner 48 is not connected to the dummy conductive portions in the dummy trench portion 30. The gate runner 48 in the present example is formed from below the contact holes 49 to an edge portion of the gate trench portion 40. An insulating film such as an oxide film or the like is formed between the gate runner 48 and the upper surface of the semiconductor substrate. In the edge portions of the gate trench portions 40, the gate conductive portions are exposed on the upper surface of the semiconductor substrate. The gate trench portions 40 contact with the gate runner 48 at the exposed portions of the gate conductive portions.

The emitter electrode 52 and the gate metal layer 50 are formed of metal-contained material. For example, at least a part of region of each electrode is formed of aluminum or aluminum-silicon alloy. Each electrode may have, in an under layer of the region formed of aluminum or the like, barrier metal which is formed of titanium, titanium compounds, or the like. Also, each electrode may have a plug formed of tungsten or the like in the contact hole.

One or more gate trench portions 40 and one or more dummy trench portions 30 are arrayed at predetermined intervals along a predetermined array direction (Y-axis direction, in the present example). The gate trench portions 40 in the present example may have two extending portions 39 which is parallel to the upper surface of the semiconductor substrate and extending along an extending direction that is perpendicular to the array direction (X-axis direction, in the present example), and connecting portions 41 to connect the two extending portions 39. Preferably, at least part of the connecting portion 41 is formed in a curved shape. Connecting end portions of the two extending portions 39 of the gate trench portions 40 can relax the electric field concentration at the end portions of the extending portions 39. The gate runner 48 may be connected to the gate conductive portion at the connecting portion 41 of the gate trench portion 40.

The dummy trench portions 30 in the present example, like the gate trench portions 40, may have U-shapes on the upper surface of the semiconductor substrate. That is, the dummy trench portion 30 in the present example may have two extending portions 29 extending along the extending direction, and connecting portions 31 to connect the two extending portions 29.

The emitter electrode 52 is formed above the gate trench portions 40, the dummy trench portions 30, the well region 11, the emitter regions 12, the base regions 14 and the contact regions 15. The well region 11 is of the second conductivity type. The well region 11 is formed in a predetermined range from an end portion of the active region on a side where the gate metal layer 50 is provided. A diffusion depth of the well region 11 may be greater than that of the gate trench portion 40 and the dummy trench portion 30. A part of region of the gate trench portion 40 and the dummy trench portion 30 closer to the gate metal layer 50 is formed in the well region 11. The bottom of the end of the gate trench portions 40 and the dummy trench portions 30 in the extending direction may be covered with the well region 11.

In the transistor portion 70, the contact hole 54 is formed above each region of the contact regions 15 and the emitter regions 12. In the diode portion 80, the contact holes 54 are formed above the base regions 14. Any contact hole 54 is not arranged above the base regions 14 and the well region 11 which are arranged on the both ends in X-axis direction.

In a direction parallel to the upper surface of the semiconductor substrate, mesa portions are provided adjacent to the trench portions respectively, in a direction perpendicular to the extending direction of the trench portions. The mesa portion may be a portion of the semiconductor substrate sandwiched by two trench portions that are next to each other, and may be a portion from the upper surface of the semiconductor substrate down to the depth of the bottom portion, which is the deepest portion, of each trench portion. The two extending portions of each trench portion may be regarded as one trench portion. That is, a region sandwiched by two of the extending portions may be regarded as a mesa portion.

In the transistor portion 70, a first mesa portion 60 is provided in direct contact with one side of each trench portion in an array direction perpendicular to the extending direction of each trench portion (Y-axis direction, in the present example). Also, second mesa portions 62 are provided in direct contact with the opposite side of said trench portion in the array direction.

Also, the boundary portion 90 is provided in a region, of the transistor portion 70, which is next to the diode portion 80. The boundary portion 90 has a boundary mesa portion 64. The boundary portion 90 may have the second mesa portions 62. The boundary portion 90 and the boundary mesa portion 64 are next to each other on the opposite side to the diode portion 80. As an example, in the boundary portion 90, the dummy trench portion 30 is arranged, but the gate trench portion 40 is not arranged. In the transistor portion 70, in regions except the boundary portion 90, the gate trench portions 40 are arranged, but the dummy trench portion 30 is not arranged.

Also, in the diode portion 80, the diode mesa portion 66 is provided in a region sandwiched by dummy trench portions 30 that are next to each other. In the diode portion 80, a plurality of contact holes 54 may be formed in one diode mesa portion 66. Also, in the transistor portion 70, a plurality of contact holes 54 may be formed in one second mesa portion 62.

The first mesa portions 60 and the second mesa portions 62 may be alternately provided in the array direction perpendicular to the extending direction of the trench portions. At the both end portions of each first mesa portion 60 and each second mesa portion 62 in X-axis direction, the base regions 14 are provided, as an example. Note that FIG. 1a shows only one of the end portions in X-axis direction.

On the upper surface of the first mesa portion 60, the emitter region 12 is provided in direct contact with the gate trench portion 40. The emitter regions 12 contacts with a gate trench portion 40 which contacts with the first mesa portion 60 in +Y-axis direction and another gate trench portion 40 which contacts with the first mesa portion 60 in −Y-axis direction. The emitter region 12 may be formed so as to connect two gate trench portions 40 which contact with each other such as to sandwich the first mesa portion 60. The emitter regions 12 in the present example are of N(+)-type.

Also, on the upper surface of the first mesa portion 60, contact region 15 of the second conductivity type having higher doping concentration than that of the base regions 14 is provided. The contact regions 15 contacts with the gate trench portions 40 which contacts with the gate trench portions 40 contacting with the first mesa portions 60 in +Y-axis direction and contacts with the first mesa portions 60 in −Y-axis direction. The contact region 15 may be formed so as to connect two gate trench portions 40 which contact with each other such as to sandwich the first mesa portion 60.

In first mesa portions 60, the emitter regions 12 and the contact regions 15 may be provided alternately and in direct contact with each other in the extending direction of the gate trench portion 40. On the upper surface of the first mesa portion 60, the emitter region 12 may be provided in direct contact with the dummy trench portion 30 or apart from it. The emitter region 12 in the example in FIG. 1a is provided in direct contact with the dummy trench portion 30.

On the upper surface of the second mesa portions 62, the contact region 15 of the second conductivity type having higher doping concentration than that of the base regions 14 is provided. Also, on the upper surface of the second mesa portions 62, the emitter regions 12 may be provided in direct contact with the gate trench portions 40, or may not be provided. FIG. 1a shows an example where the emitter region 12 is not provided on the upper surface of the second mesa portion 62. On the upper surface of the second mesa portions 62, the contact regions 15 may be provided in direct contact with the dummy trench portions 30 or apart from the dummy trench portions 30. The contact region 15 in the example in FIG. 1a is provided in direct contact with the dummy trench portion 30.

The semiconductor device 100 has an accumulation region 16 of the first conductivity type below the base region 14 inside the semiconductor substrate. In FIG. 1a, a range where the accumulation region 16 is formed is indicated by a dashed line. The accumulation region 16 is formed, in the top view of the semiconductor substrate, on +X-axis direction side from a region where the contact region 15 at an end in −X-axis direction and the contact hole 54 overwrap. Note that the accumulation region 16 may not be provided in the second mesa portion 62.

The width Wwm of the second mesa portion 62 in Y-axis direction is greater than the width Wm of the first mesa portion 60 in Y-axis direction. Wwm is the width of the semiconductor substrate in Y-axis direction which is sandwiched by two trench portions sandwiching the second mesa portions 62 in XY-plane. Wm is the width of the semiconductor substrate in Y-axis direction which is sandwiched by two trench portions sandwiching the first mesa portion 60 in XY-plane. Wwm may be twice Wm or more, or may be five times Wm or more.

On the upper surface of the boundary mesa portion 64, the contact region 15 of the second conductivity type having higher doping concentration than that of the base region 14 is provided. The contact regions 15 may be provided in an entire region sandwiched by the base regions 14 which are provided on the both end portions of the boundary mesa portion 64 in X-axis direction.

On the upper surface of the diode mesa portion 66, the contact region 15 is provided on the both end portions in X-axis direction. Also, the base region 14 is provided in regions sandwiched by the contact regions 15. The base region 14 may be provided in the entire regions sandwiched by the contact regions 15.

In the semiconductor device 100 in the present example, the dummy trench portion 30 is provided in the diode portion 80. In the present example, the linear extending portions 29 of each dummy trench portion 30 are connected in the connecting portion 31, as an example. In a region sandwiched by the dummy trench portions 30, the diode mesa portion 66 is provided.

On the diode mesa portion 66, the emitter region 12 may not or may be formed. In the present example, the emitter region 12 is not formed. In the diode mesa portions 66, the contact region 15 or the base region 14 is formed from one dummy trench portion 30 to the other dummy trench portion 30, having the diode mesa portion 66 therebetween. That is, on the upper surface of the semiconductor substrate, the width of the diode mesa portion 66 in Y-axis direction is equal to the width, in Y-axis direction, of the contact region 15 or the base region 14 which is provided to the diode mesa portion 66.

The diode portion 80 has a cathode region 82 of the first conductivity type on the lower surface of the semiconductor substrate side. The cathode region 82 in the present example is of N(+)-type. FIG. 1a shows a region, by a dashed line, where the cathode region 82 is provided in the top view of the semiconductor substrate. The diode portion 80 may be a region obtained by projecting the cathode region 82 on the upper surface of the semiconductor substrate. The region obtained by projecting the cathode region 82 on the upper surface of the semiconductor substrate may be apart from the contact region 15 in +X-axis direction.

In a region of the diode portion 80 which is exposed on the lower surface of the semiconductor substrate and where the cathode region 82 is not formed, a collector region of P(+)-type may be formed. In the present example, for the dummy trench portion 30 or the diode mesa portion 66 on the upper surface of the semiconductor substrate where the cathode region 82 of the lower surface of the semiconductor substrate is projected, the collector region is formed at a position where an end portion of the contact hole 54 of the diode mesa portion 66 on the outer circumferential side (in a direction of −X-axis direction) is projected on the lower surface of the semiconductor substrate. As an example, a dummy trench portion 30 or a diode mesa portion 66 with the cathode region 82 formed on part of the lower surface of the semiconductor substrate, the dummy trench portion 30 or the diode mesa portion 66 up to the end portion (including the connecting portion in U-shape) of the dummy trench portion 30 in the extending direction may be conveniently regarded as the diode portion 80, even though the collector region is formed on the lower surface of the semiconductor substrate.

The transistor portion 70 may be a region where at least either one of the trench portion or the mesa portion is formed within the region obtained by projecting the collector regions on the upper surface of the semiconductor substrate. Also, within the transistor portion 70, a region where the dummy trench portion 30 and the mesa portion that is sandwiched by the dummy trench portions 30 are formed may be regarded as the boundary portion 90.

Figure 1B:
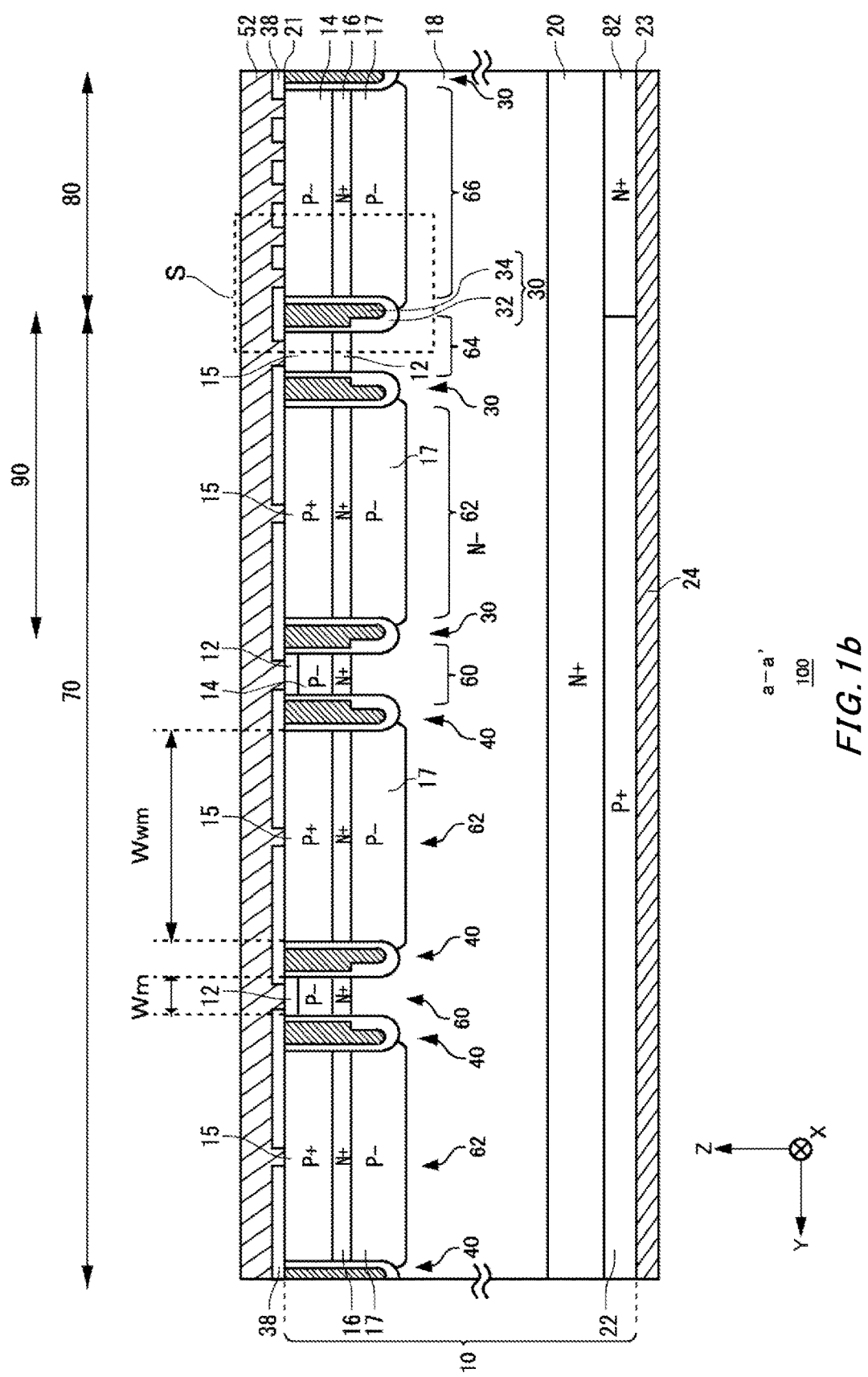

FIG. 1b illustrates an exemplary a-a' cross-section in FIG. 1a. The a-a' cross-section is YZ-plane which passes through the emitter regions 12, the contact regions 15 and the base regions 14 in the transistor portion 70 and the diode portion 80. The semiconductor device 100 in the present example has the semiconductor substrate 10, the interlayer dielectric films 38, the emitter electrode 52 and the collector electrode 24 on the a-a' cross-section. The emitter electrode 52 is formed on an upper surface 21 of the semiconductor substrate 10 and an upper surface of the interlayer dielectric films 38.

The collector electrode 24 is formed on a lower surface 23 of the semiconductor substrate 10. The emitter electrode 52 and the collector electrode 24 are formed of conductive material such as metal. In the present specification, a direction to connect the emitter electrode 52 and the collector electrode 24 is referred to as a depth direction (Z-axis direction).

The semiconductor substrate 10 may be a silicon substrate, a silicon carbide substrate, or a nitride semiconductor substrate such as gallium nitride or the like. The semiconductor substrate 10 in the present example is a silicon substrate.

The semiconductor substrate 10 in the present example includes a drift region 18 of the first conductivity type. The drift region 18 in the present example is of N(−)-type. The drift region 18 may be a remaining region where the other doping regions are not formed. Also, below the drift region 18, a buffer region 20 of N(+)-type is formed. The doping concentration of the buffer region 20 is higher than the doping concentration of the drift region 18. The buffer region 20 may function as a field stop layer which prevents the depletion layers expanding from the lower surface side of base regions 14 from reaching the collector region 22 of P(+)-type and the cathode region 82 of N(+)-type.

The diode portion 80 has the cathode region 82 of N(+)-type below the buffer region 20. The cathode region 82 may be provided at the same depth of that of the collector region 22 of the transistor portion 70. By the cathode region 82 being provided at the same depth of that of the collector region 22 of the transistor portion 70, when the transistor portion 70 of another semiconductor device 100 is turned off in a power conversion circuit such as an inverter, the diode portion 80 may function as a free wheeling diode (FWD) which flows free wheeling current conducting in the opposite direction.

In the transistor portion 70, below the buffer region 20, the collector region 22 of P(+)-type is formed. The collector region 22 may extend up to a region on a lower surface 23 side of the boundary mesa portion 64. The collector region 22 extending up to the lower surface 23 of the boundary mesa portion 64 can allocate the distance between the emitter region 12 of the transistor portion 70 and the cathode region 82 of the diode portion 80. This can prevent electrons implanted to the drift region 18 from a gate structure portion including the emitter regions 12 of the transistor portion 70 from flowing out to the cathode region 82 of the diode portion 80.

In the present example, as compared with a case where the cathode region 82 is provided up to directly under the boundary mesa portion 64, the distance between the contact region 15 of the boundary mesa portion 64 and the cathode region 82 of the diode portion 80 can also be made longer. This can reduce implantation of holes, when the diode portion 80 is conducted, from the contact region 15 having higher doping concentration than that of the base region 14 to the cathode region 82.

In the first mesa portion 60, the accumulation region 16 of the first conductivity type is provided above the drift region 18. The accumulation region 16 is provided in direct contact with the gate trench portion 40. The doping concentration of the accumulation region 16 is higher than the doping concentration of the drift region 18. The accumulation region 16 being provided can enhance a carrier injection enhancement effect (IE effect) to decrease an ON voltage.

In the first mesa portion 60, the base region 14 of the second conductivity type is provided above the accumulation region 16. The base region 14 is provided in direct contact with the gate trench portion 40. Further, in the first mesa portion 60, the emitter region 12 is provided between the base region 14 and the upper surface 21. The emitter region 12 is provided in direct contact with the gate trench portion 40. The doping concentration of the emitter region 12 is higher than the doping concentration of the drift region 18. An example of a dopant of the emitter region 12 is arsenic (As).

In the second mesa portion 62, the intermediate region 17 of the second conductivity type is provided above the drift region 18. The intermediate region 17 is provided in direct contact with the gate trench portion 40. Also, in the second mesa portion 62, the accumulation region 16 of the first conductivity type may or may not be provided above the intermediate region 17. The FIG. 1b shows an example where the accumulation region 16 is provided. Also, on the upper surface 21 of the second mesa portion 62, the contact region 15 is provided above the intermediate region 17. The contact region 15 is provided in direct contact with the gate trench portion 40. The contact region 15 may be provided deeper, in the depth direction of the semiconductor substrate 10, than the emitter region 12 of the first mesa portion 60.

In the boundary mesa portion 64, the accumulation region 16 of the first conductivity type is provided above the drift region 18. The accumulation region 16 is provided in direct contact with the gate trench portion 40. Also, in the boundary mesa portion 64, the contact region 15 of the second conductivity type is provided above the accumulation region 16. The contact region 15 is provided in direct contact with the gate trench portion 40. In the boundary mesa portion 64, the emitter region 12 may not be provided.

In the semiconductor device 100 in the present example, the plurality of gate trench portions 40 are provided next to each other with the second mesa portions 62 therebetween. Between the gate trench portions 40 that are next to each other, the dummy trench portion 30 may not be provided. Note that, on the negative side of Y-axis direction of the diode portion 80 in FIG. 1b, the transistor portion 70 (not shown) may exist. The diode portions 80 and the transistor portions 70 may be alternately arranged in Y-axis direction. In each transistor portion 70, in regions except the boundary portion 90, the gate trench portions 40 may be provided, and the dummy trench portion 30 may not be provided. That is, in each transistor portion 70, the dummy trench portion 30 is not provided except the boundary portion 90 between the transistor portion 70 and the diode portion 80. Reducing the dummy trench portions 30 allows to effectively perform screening etc. of an insulating film of the dummy trench portion 30. Also, the width Wwm of the second mesa portion 62 in Y-axis direction is greater than the width Wm in Y-axis direction of the first mesa portion 60. Wwm may be twice Wm or more.

In a region, of the transistor portion 70, that is next to the boundary mesa portion 64, the dummy trench portion 30 may be provided. Also, in the diode portion 80, the dummy trench portion 30 may be provided.

In the diode mesa portion 66, the intermediate region 17 of the second conductivity type may be provided above the drift region 18. The intermediate region 17 may be provided in direct contact with the dummy trench portion 30. Also, in the diode mesa portion 66, the accumulation region 16 of the first conductivity type may be provided above the intermediate region 17. The accumulation region 16 may be provided in direct contact with the dummy trench portion 30. Also, in the diode mesa portion 66, the base region 14 may be provided above the accumulation region 16. In the diode mesa portion 66, the emitter region 12 may or may not be provided.

On the upper surface 21, one or more gate trench portion(s) 40 and one or more dummy trench portion(s) 30 are formed. Each trench portion is provided from the upper surface 21 through the drift region 18. In regions where at least any of the emitter region 12, the contact region 15 and the accumulation region 16 is provided, trench portions each reach the drift region 18, penetrating these regions as well. A configuration where the trench portion penetrates the doping region is not limited to configurations which are manufactured in order of forming the trench portion after forming the doping region. A configuration where the doping region between the trench portions is formed after forming the trench portion is also included in the configuration where the trench portion penetrates the doping region.

In FIG. 1b, the dummy trench portion 30 may have the same structure as that of the gate trench portion 40. The dummy trench portion 30 has a dummy trench, the dummy insulating film 32 and the dummy conductive portion 34 which are formed on the upper surface 21 side. The dummy insulating film 32 is formed covering an inner wall of the dummy trench. The dummy conductive portion 34 is formed inside the dummy trench and formed more inward than the dummy insulating film 32. The dummy insulating film 32 insulates the dummy conductive portion 34 and the semiconductor substrate 10 from each other.

Figure 2A:
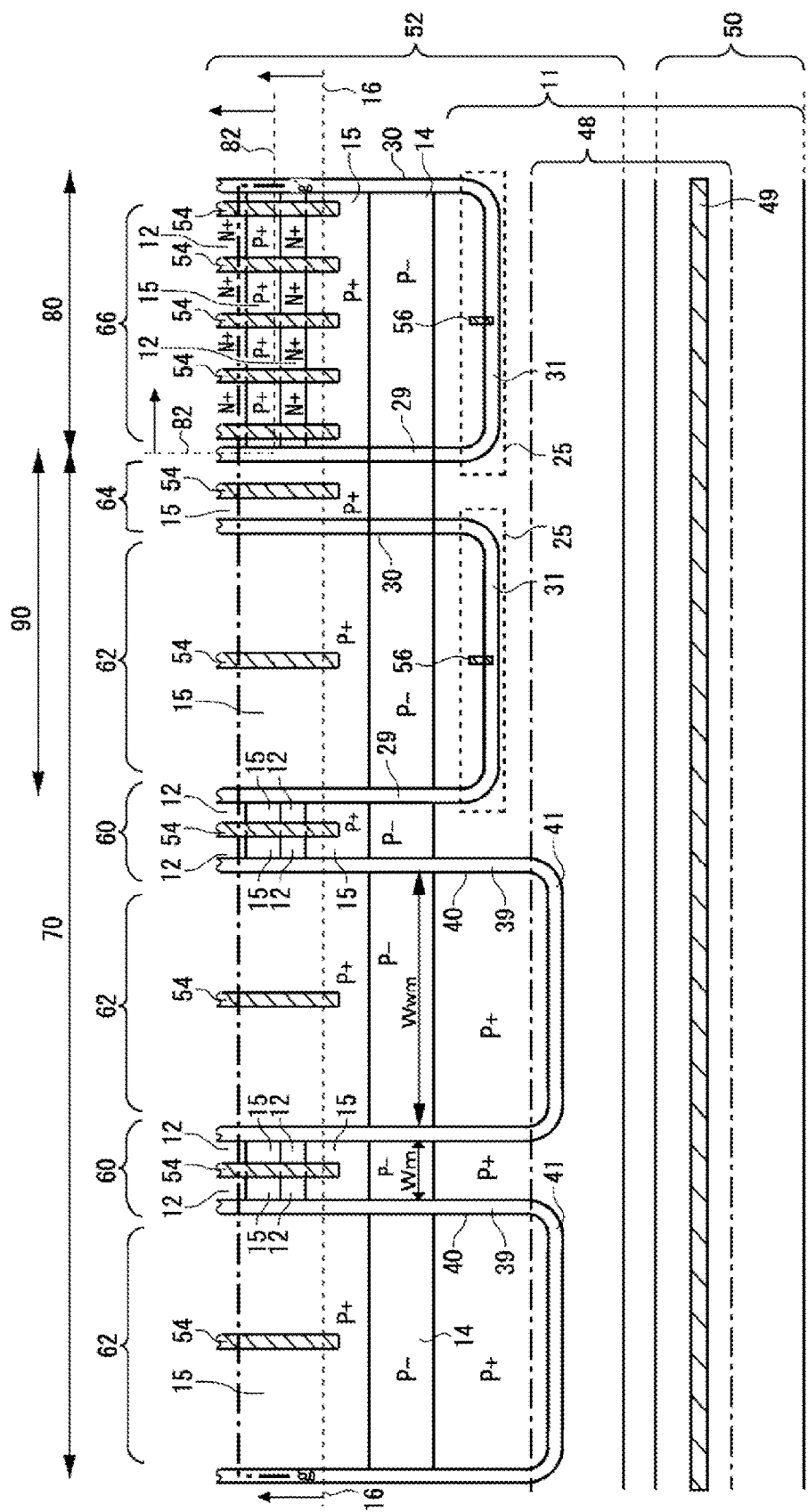
FIG. 2a partially illustrates another exemplary upper surface of the semiconductor device 100 according to the present embodiment.

FIG. 2a partially illustrates another exemplary upper surface of a semiconductor device 100 according to the present embodiment. The semiconductor device 100 shown in FIG. 2a is different from the semiconductor device 100 shown in FIG. 1a in a point where, in a region where the base region 14 is formed on the upper surface of the diode mesa portion 66 in the semiconductor device 100 shown in FIG. 1a, the emitter region 12 and the contact region 15 are alternately formed in X-axis direction such that a contacting boundary between the emitter region 12 and the contact region 15 is parallel to Y-axis direction.

As shown in FIG. 2a, the emitter region 12 and the contact region 15 in the diode mesa portion 66 are provided over the entire diode mesa portion 66 in Y-axis direction, from the one dummy trench portion 30 extending in X-axis direction in the diode portion 80 to the other dummy trench portion 30 extending in X-axis direction and connected to the one dummy trench portion 30 in the connecting portion 31. Also, the emitter region 12 and the contact region 15 in the diode mesa portion 66 are provided contacting with both of the one dummy trench portion 30 and the other dummy trench portion 30.

Figure 2B:
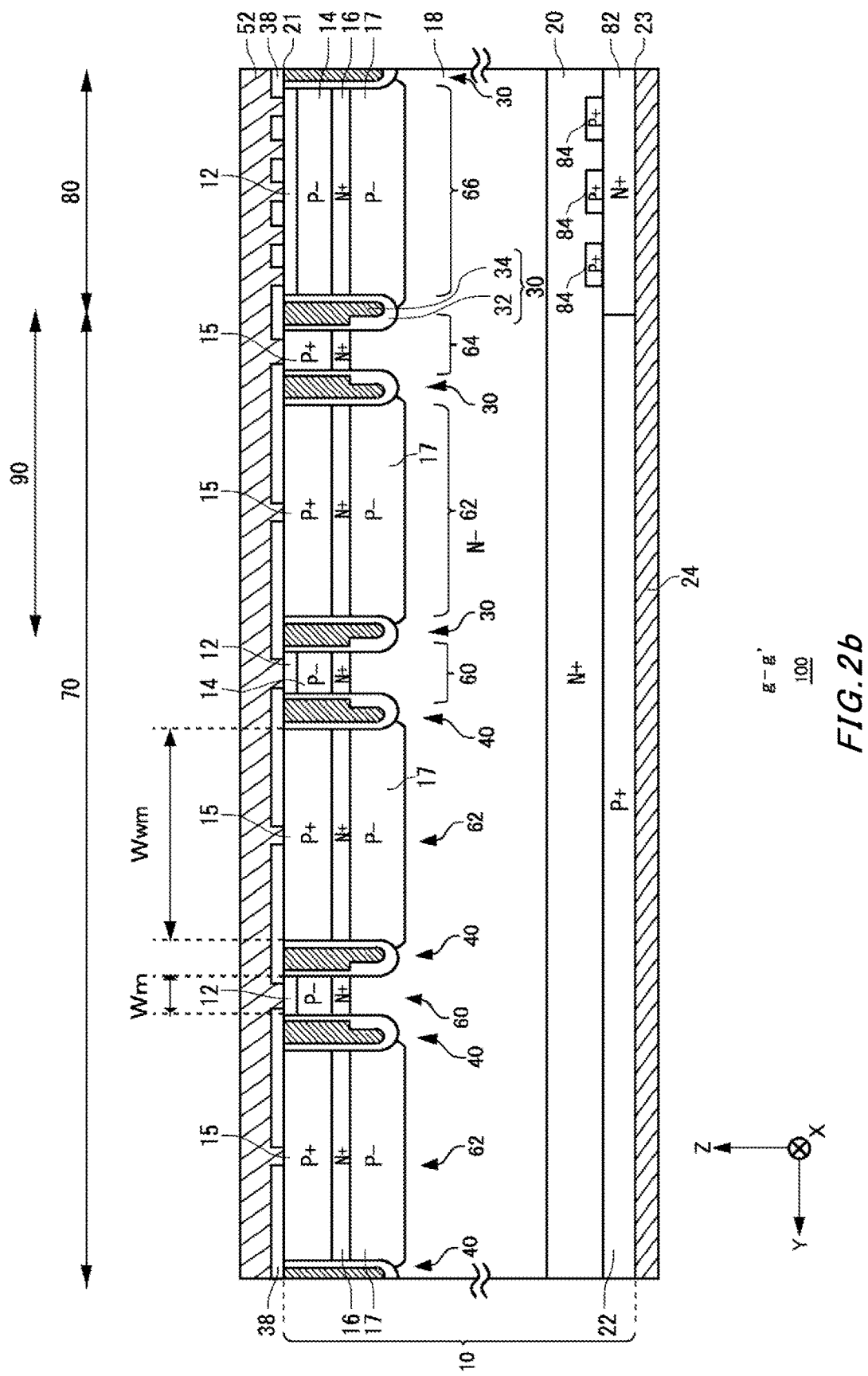

FIG. 2b illustrates an exemplary g-g' cross-section in FIG. 2a. As shown in FIG. 2b, the semiconductor device 100 in the present example has the emitter region 12 on the upper surface 21 of the diode portion 80 in g-g' cross-section. Also, it has floating regions 84 above the cathode region 82 of the diode portion 80.

In the diode mesa portion 66, as shown in FIG. 2b, the intermediate region 17 of the second conductivity type may be provided above the drift region 18. The intermediate region 17 may be provided in direct contact with the dummy trench portion 30. Also, in the diode mesa portion 66, the accumulation region 16 of the first conductivity type may be provided above the intermediate region 17. The accumulation region 16 may be provided in direct contact with the dummy trench portion 30. Also, in the diode mesa portion 66, the base region 14 may be provided above the accumulation region 16. Above the base region 14, the emitter regions 12 may be provided.

Note that, since FIG. 2b is the exemplary g-g' cross-section in FIG. 2a, the emitter region 12 is provided above the base region 14. In FIG. 2a, in a cross-section which is parallel to g-g' cross-section, the cross-section at a position where the contact region 15 is provided on the upper surface 21 on more positive side or more negative side in X-axis direction than the position of g-g' cross-section, the contact regions 15 are provided above the base regions 14.

In the semiconductor device 100 in the present example, the emitter region 12 and the contact region 15 are alternately formed in the diode mesa portion 66 in X-axis direction, such that a contacting boundary between the emitter region 12 and the contact region 15 is perpendicular to the extending direction of the dummy trench portion 30 (parallel to Y-axis direction). This can prevent and reduce, in the diode portion 80, implantation of carriers 18 (implantation of holes, in the present example) from the base region 14 or the intermediate region 17 into the drift region. Thus, reverse recovery loss of the diode portion 80 can be made reduced. Also, the semiconductor device 100 in the present example has the intermediate region 17 and the floating regions 84 in the diode portion 80, and thus can prevent and reduce reverse recovery surge of the diode portion 80.

Figure 3A:
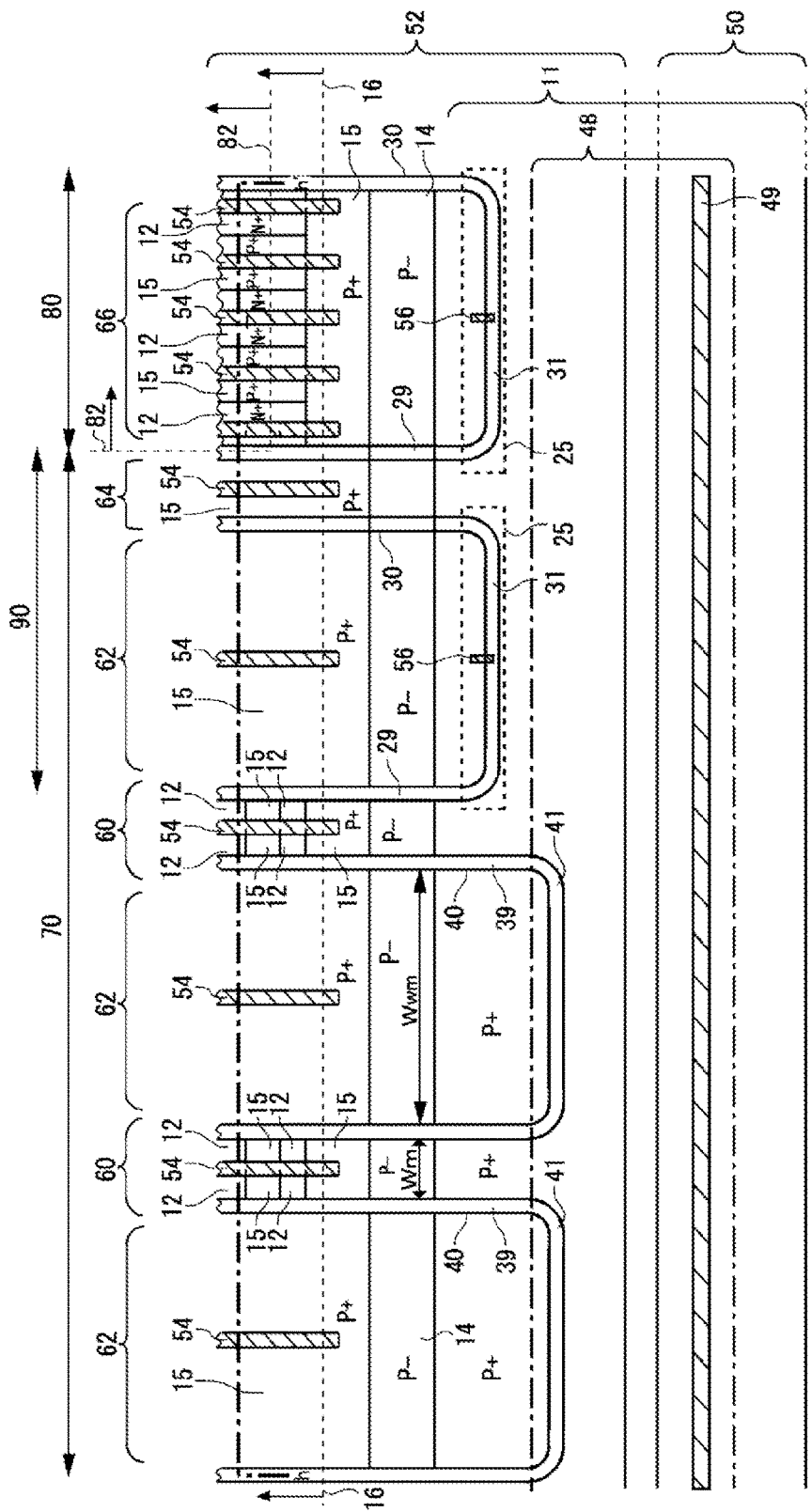
FIG. 3a partially illustrates still another exemplary upper surface of the semiconductor device 100 according to the present embodiment.

FIG. 3a partially illustrates still another exemplary upper surface of a semiconductor device 100 according to the present embodiment. The semiconductor device 100 shown in FIG. 3a is different from the semiconductor device 100 shown in FIG. 1a in a point where, in a region where the base region 14 is formed on the upper surface of the diode mesa portion 66 in the semiconductor device 100 shown in FIG. 1a, the emitter region 12 and the contact region 15 are alternately formed in Y-axis direction such that a contacting boundary between the emitter region 12 and the contact region 15 is parallel to X-axis direction.

As shown in FIG. 3a, the emitter regions 12 of the diode mesa portion 66 are provided below the contact holes 54 from the positive side of the contact holes 54 to the negative side thereof in Y-axis direction. As shown in FIG. 3a, the contact regions 15 of the diode mesa portion 66 may be provided below the contact hole 54 from the positive side of the contact holes 54 to the negative side thereof in Y-axis direction.

The emitter region 12 that is provided on the most positive side in Y-axis direction in the diode mesa portion 66 may contact with the dummy trench portion 30 in the diode portion 80 on the positive side of Y-axis direction. The emitter region 12 that is provided on the most negative side in Y-axis direction in the diode mesa portion 66 may contact with the dummy trench portion 30 in the diode portion 80 on the negative side of Y-axis direction. In the present example, the emitter regions 12 contact with the dummy trench portions 30, but the contact regions 15 may be provided between the dummy trench portions 30 and the emitter region in Y-axis direction and the contact regions 15 may contact with the dummy trench portions 30.

Figure 3B:
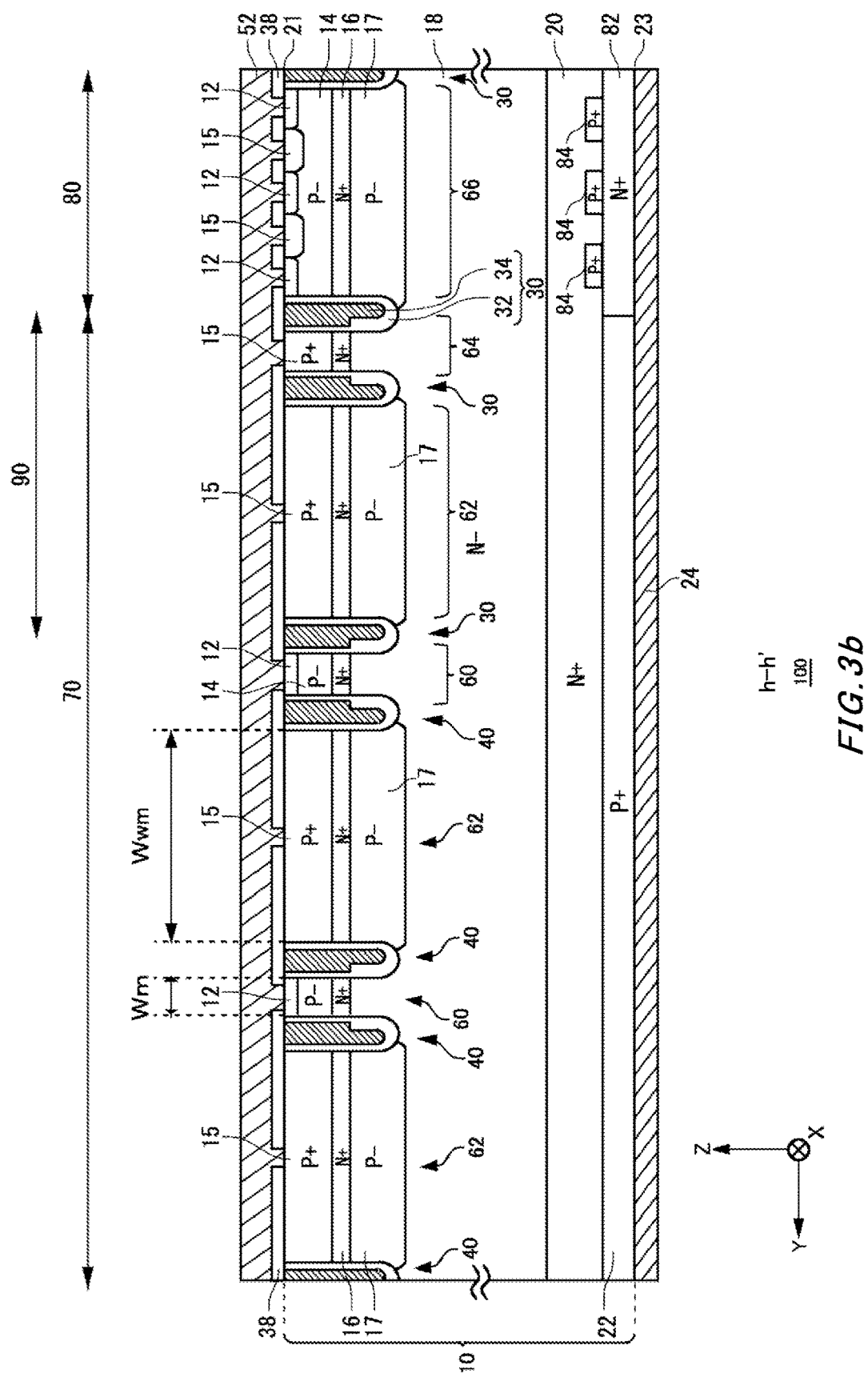

FIG. 3b is illustrates an exemplary h-h' cross-section in FIG. 3a. As shown in FIG. 3b, the semiconductor device 100 in the present example has, in h-h' cross-section, the emitter regions 12 and the contact regions 15 on the upper surface 21 of the diode portion 80. Also, it has floating regions 84 above the cathode region 82 of the diode portion 80.

In the diode mesa portion 66, as shown in FIG. 3b, the intermediate region 17 of the second conductivity type may be provided above the drift region 18. The intermediate region 17 may be provided in direct contact with the dummy trench portion 30. Also, in the diode mesa portion 66, the accumulation region 16 of the first conductivity type may be provided above the intermediate region 17. The accumulation region 16 may be provided in direct contact with the dummy trench portion 30. Also, in the diode mesa portion 66, the base region 14 may be provided above the accumulation region 16. Above the base region 14, the emitter regions 12 and the contact regions 15 may be provided.

In the semiconductor device 100 in the present example, the emitter region 12 and the contact region 15 are alternately formed in the diode mesa portion 66 in Y-axis direction, such that a contacting boundary between the emitter region 12 and the contact region 15 is parallel to the extending direction of the dummy trench portion 30 (X-axis direction). This can prevent and reduce, in the diode portion 80, implantation of carriers 18 from the base region 14 or the intermediate region 17 into the drift region. Thus, reverse recovery loss of the diode portion 80 can be made reduced. Also, the semiconductor device 100 in the present example has the intermediate region 17 and the floating regions 84 in the diode portion 80, and thus can prevent and reduce reverse recovery surge of the diode portion 80.

Figure 4A:
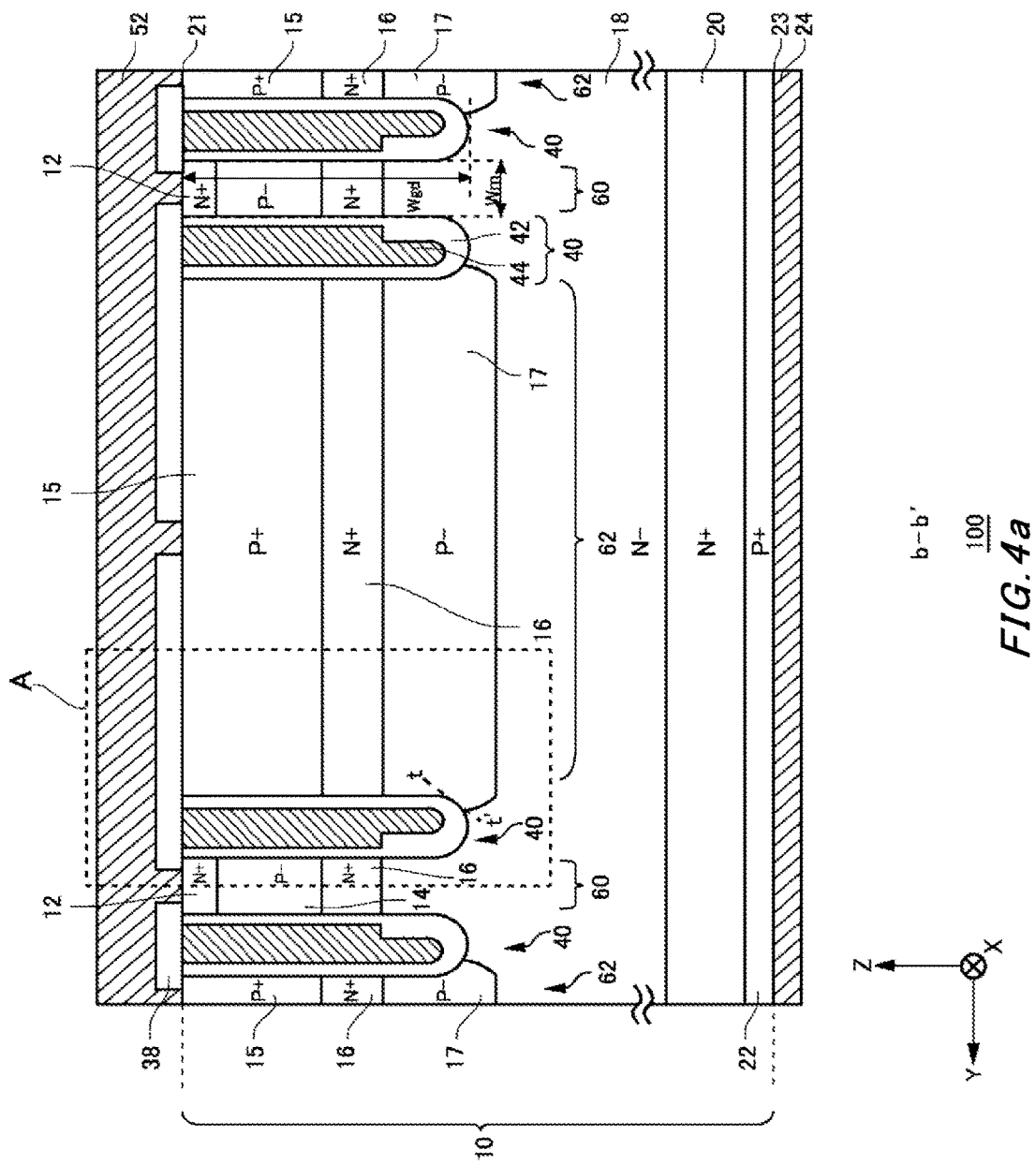

FIG. 4a illustrates an exemplary b-b' cross-section in FIG. 1a. As shown in FIG. 4a, the gate trench portion 40 has the gate trench, the gate-insulating film 42, and the gate conductive portion 44 which are formed on the upper surface 21. The gate-insulating film 42 is formed covering the inner wall of the gate trench. The gate-insulating film 42 may be formed by oxidizing or nitriding a semiconductor that is the inner wall of the gate trench. The gate conductive portion 44 is formed more inward than the gate-insulating film 42 within the gate trench. The gate-insulating film 42 insulates the gate conductive portion 44 and the semiconductor substrate 10 from each other. The gate conductive portion 44 is formed of conductive material such as polysilicon or the like.

The gate conductive portion 44 includes a region facing the neighboring base region 14 on the first mesa portion 60 side, having the gate-insulating film 42 therebetween. When predetermined voltage is applied to the gate conductive portion 44, a channel of an inversion layer of electrons is formed on the surface layer of the boundary surface contacting with the gate trench of the base region 14. Also, The gate conductive portion 44 includes a region facing the neighboring contact region 15 on the second mesa portion 62 side, having the gate-insulating film 42 therebetween. Also, the gate trench portion 40 is covered with the interlayer dielectric film 38 on the upper surface 21.

As shown in FIG. 4a, the mesa width Wm of the first mesa portion 60 may be smaller than the depth Wgd from the upper surface 21 to an end of a bottom portion of the gate trench. Making Wm smaller than Wgd can make withstand voltage of the transistor portion 70 higher. The mesa width Wm may be half the depth Wgd or less, or may be one third of that or less.

In the second mesa portion 62, the accumulation region 16 having higher doping concentration than that of the drift region 18 may be provided above the intermediate region 17 and below the contact region 15. FIG. 4a shows an example where, in the second mesa portion 62, the accumulation region 16 is provided in direct contact with the gate trench portion 40. By the accumulation region 16 being provided in direct contact with the gate trench portion 40, holes moving from the lower surface 23 side to the upper surface 21 side inevitably pass through the accumulation region 16. This can prevent and reduce the holes passing through from the lower surface 23 side to the upper surface 21 side.

As shown in FIG. 4a, the intermediate region 17 may cover at least part of the bottom portion of the gate trench portion 40. The bottom portion of the gate trench portion 40 may be a portion where the absolute value of inclination of a tangent line t-t' of the inner wall of the gate trench on YZ-plane with respect to the upper surface 21 of the semiconductor substrate 10 is within the range between 0 degree (i.e. parallel to the upper surface 21) and 45 degrees. However, even when the inclination of the tangent line t-t' falls within the above-described range on upper side than the center of the gate trench portion 40 in the depth direction, the region is not included in the bottom portion. Forming the intermediate region 17 down to the depth so as to cover at least part of the bottom portion of the gate trench portion 40 can make the withstand voltage of the transistor portion 70 higher as compared with the case where forming the intermediate region 17 down to the depth so as not to cover the bottom portion of the gate trench portion 40. Also, the intermediate region 17 being provided allows the holes to be smoothly extracted from the lower surface 23 side. Thus, trade-off between the ON voltage and the turn-off loss can be made smoothly. The intermediate region 17 may, or may not be connected to the contact region 15 with the P-type region therebetween.

The doping concentration of the contact region 15 and the intermediate region 17 in the second mesa portion 62 may be higher than the doping concentration of the base region 14 in the first mesa portion 60. Making the doping concentration of the contact region 15 and the intermediate region 17 higher than the doping concentration of the base region 14 can make the withstand voltage of the transistor portion 70 high.

The doping concentration of the contact region 15 in the second mesa portion 62 may be equal to the doping concentration of the base region 14 in the first mesa portion 60. Here, that the doping concentration is equal to each other refers to a case where the doping concentration of the contact region 15 includes an error range of 5% or less from the doping concentration of the base region 14. In case where "equal", "uniform", "the same" and the like are described in the present specification, they may include an error of 5% or less. Making the doping concentration of the contact region 15 equal to the doping concentration of the base region 14 each other allows the contact region 15 and the base region 14 to be doped in the same process. This can simplify a doping process of the contact region 15 and the base region 14.

Figure 4B:
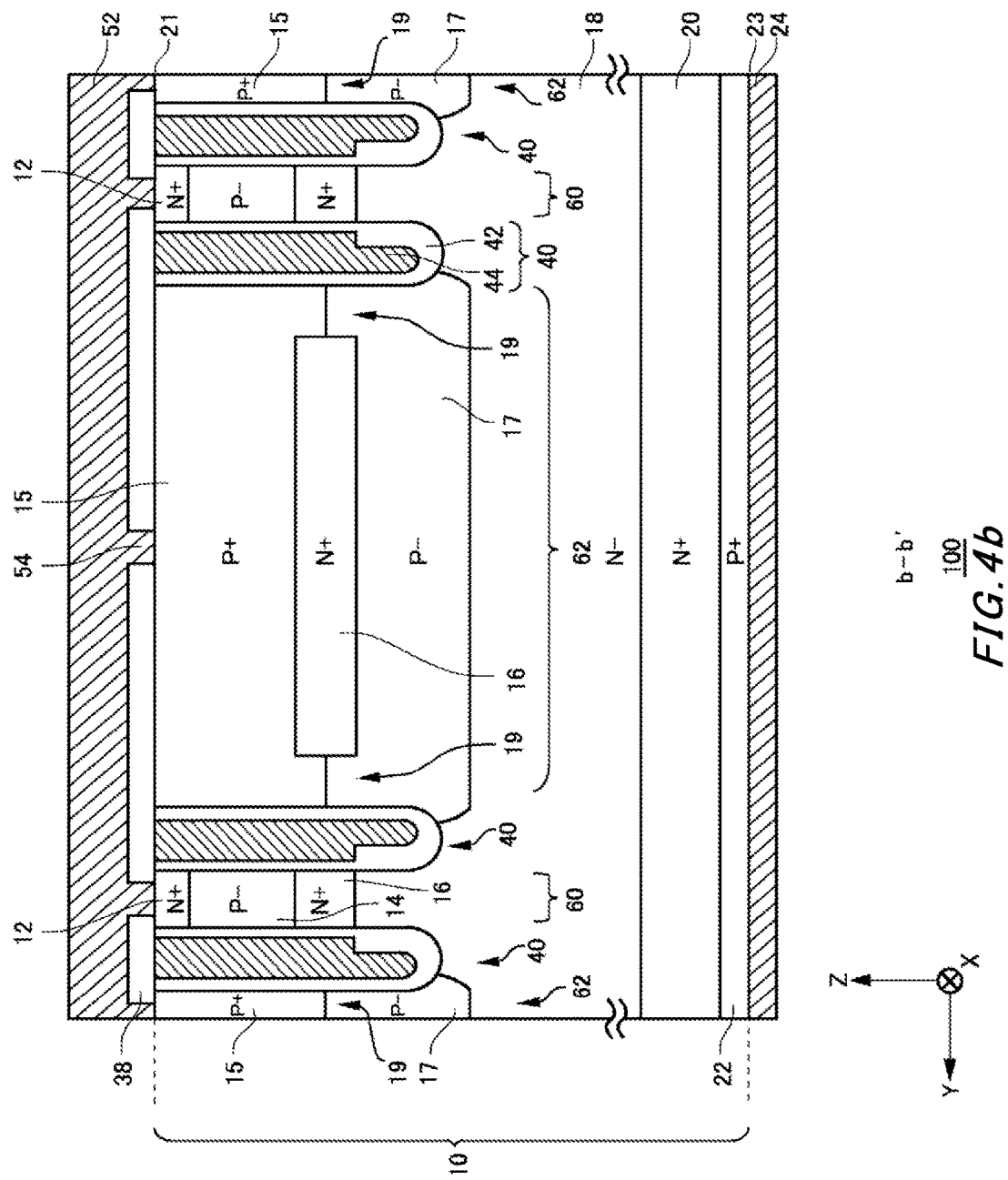

FIG. 4b illustrates another exemplary b-b' cross-section in FIG. 1a. FIG. 4b is different from FIG. 4a in a point that the accumulation region 16 is provided spaced apart from the gate trench portions 40. The accumulation region 16 being provided spaced apart from the gate trench portions 40 allows holes to be easily extracted. Also, the accumulation region 16 being provided spaced apart from the gate trench portions 40 causes the depletion layer to expand from the contact hole 54. Thus, the withstand voltage of the transistor portion 70 can be made higher, as compared with a case where the accumulation region 16 is provided in direct contact with the gate trench portion 40.

Figure 4C:
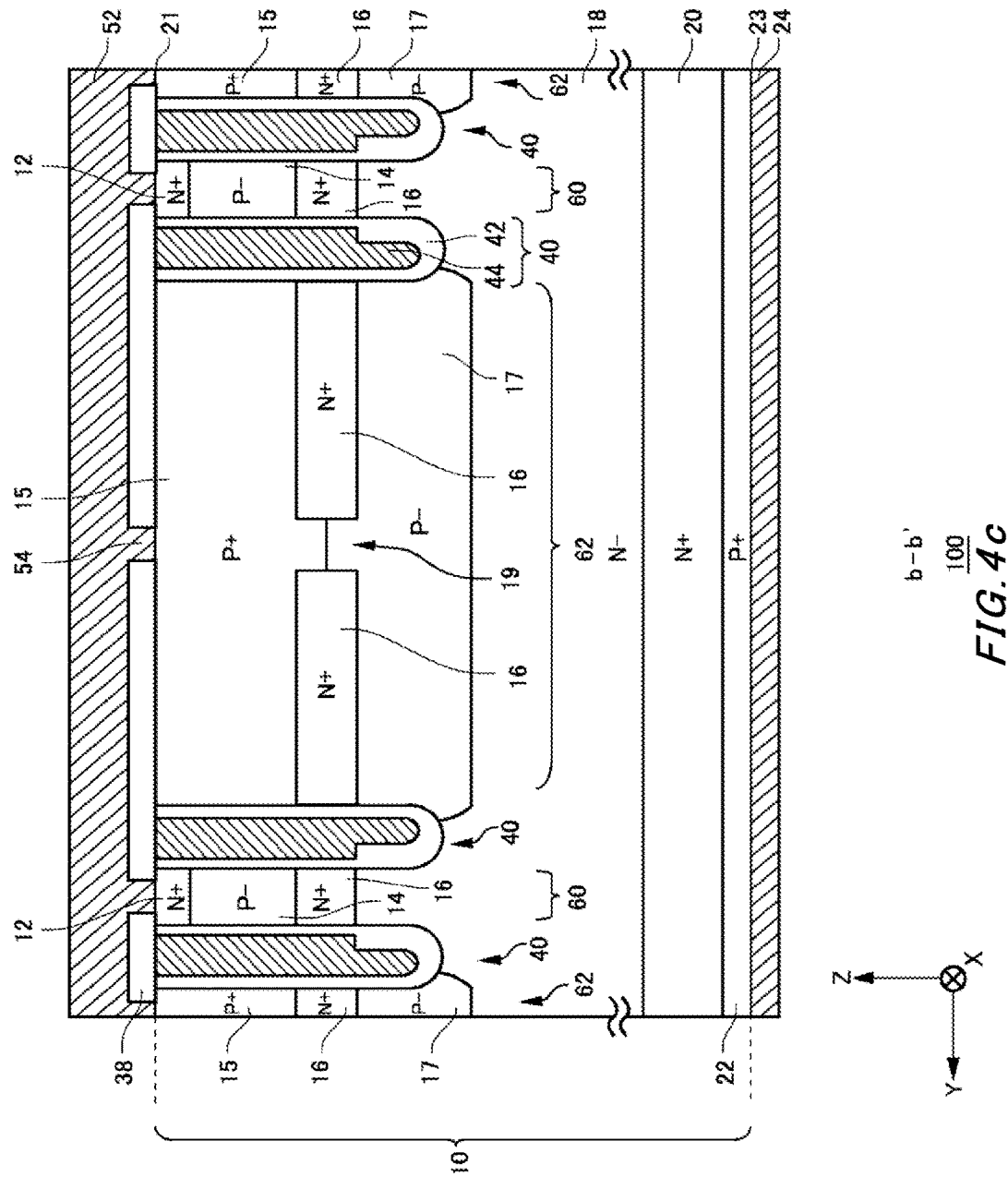

FIG. 4c illustrates still another exemplary b-b' cross-section in FIG. 1a. FIG. 4c is different from FIG. 4a in a point that an opening 19 is provided in the accumulation region 16. The opening 19 being provided in the accumulation region 16 allows holes to be easily extracted. Also, the opening 19 being provided in the accumulation region 16 causes the depletion layer to expand from the contact hole 54. Thus, the withstand voltage of the transistor portion 70 can be made higher, as compared with a case where the opening 19 is not provided in the accumulation region 16. FIG. 4c shows an example where one opening 19 is provided, but a plurality of openings 19 may be provided. Also, FIG. 4c shows an example where the opening 19 is provided at the center of the second mesa portion 62, but it may be formed closer to either one of the gate trench portions 40.

Figure 5A:
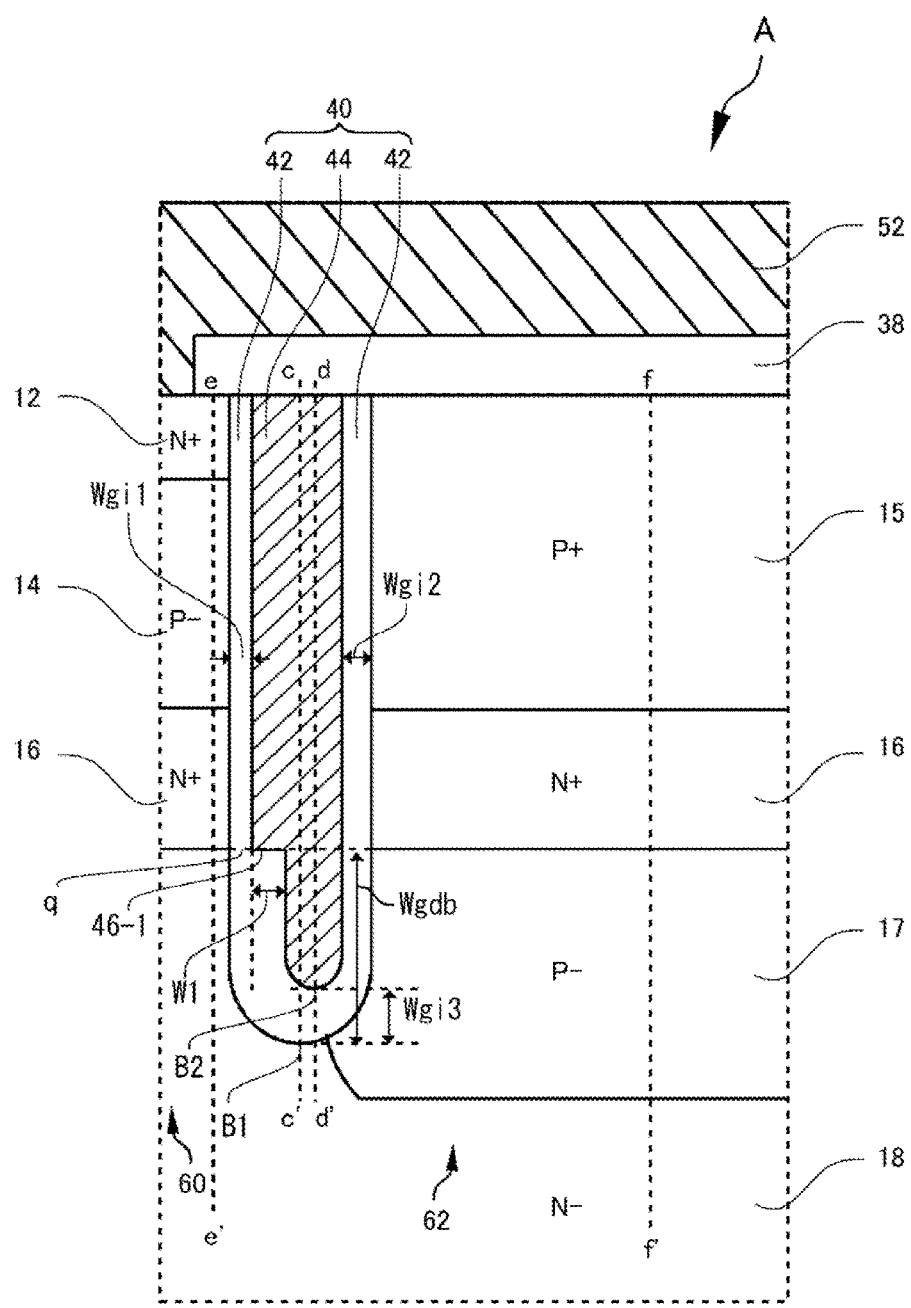

FIG. 5a is an enlarged view of the region A in FIG. 4a. As shown in FIG. 5a, the bottom portion of the gate conductive portion 44 has a first step 46-1 on a side facing the first mesa portion 60. The first step 46-1 is provided, in Y-axis direction, in a direction from the surface of the gate conductive portion 44 toward the inside thereof. The width W1 of the first step 46-1 is a distance in Y-axis direction from a surface of the gate conductive portion 44 above the first step 46-1 to a surface of the gate conductive portion 44 below the first step 46-1. Also, Wgdb is a depth in Z-axis direction from the first step 46-1 to a bottom portion end B1 of the gate trench portion 40. The bottom portion end B1 of the gate trench portion 40 refers to the lowermost bottom end of the gate trench portion 40 in Z-axis direction in FIG. 5a. The first step 46-1 being provided in the gate conductive portion 44 can prevent and reduce generation of the p-type inversion layer at the bottom portion of the gate trench portion 40 on the first mesa portion 60 side, as compared with a case where the first step 46-1 is not provided. This can prevent and reduce turn-on loss which is generated by the holes being extracted from the p-type inversion layer to the emitter region 12. Also, as shown in FIG. 5a, at least part of the intermediate region 17 is provided between the first step 46-1 and the bottom portion of the gate trench portion 40.

A thickness Wgi1 of the gate-insulating film 42 above the first step 46-1 on the side facing the first mesa portion 60 may be different from a thickness Wgi2 of the gate-insulating film 42 on the side facing the second mesa portion 62. As shown in FIG. 5a, Wgi1 and Wgi2 may satisfy the relationship of Wgi1<Wgi2. That is, Wgi2 may be formed thicker than Wgi1. Wgi2 being formed thicker than Wgi1 can make capacity between the collector electrode 24 and the gate trench portion 40 in the second mesa portion 62 smaller than capacity between the collector electrode 24 and the gate trench portion 40 in the first mesa portion 60. This can reduce the turn-on loss. Also, the depth Wgi3 from a bottom portion end B2 of the gate conductive portion 44 to the bottom portion end B1 of the gate trench portion 40 may be greater than Wgi1 and Wgi2. That is, Wgi1, Wgi2, and Wgi3 may satisfy the relationship Wgi1<Wgi2<Wgi3. Wgi3 being formed greater than Wgi1 and Wgi2 can prevent and reduce the p-type inversion layer generated at the bottom portion of the gate trench portion 40. This can prevent and reduce, in the first mesa portion 60, the turn-on loss which is generated by the holes being extracted from the p-type inversion layer to the emitter region 12.

As shown by a dashed line q in FIG. 5a, the first step 46-1 may be provided at approximately the same depth as that of the lower surface of the accumulation region 16 of the first mesa portion 60. The lower surface of the accumulation region 16 may refer to a boundary where the accumulation region 16 of the first mesa portion 60 has the doping concentration five times that of the drift region 18. In other examples, a depth position approximately the same as a boundary between the accumulation region 16 and the intermediate region 17 in the second mesa portion 62 may be regarded as the lower surface of the accumulation region 16 of the first mesa portion 60. The first step 46-1 being provided at the same height as that of the lower surface of the accumulation region 16 can prevent and reduce generation of the p-type inversion layer of the bottom portion of the gate trench portion 40 in the accumulation region 16. The first step 46-1 may be arranged above the lower surface of the accumulation region 16.

As shown in FIG. 5a, the bottom portion end B2 of the gate conductive portion 44 may be provided, in Y-axis direction, closer to the second mesa portion 62 than the center of the gate trench portion 40. That the bottom portion end B2 of the gate conductive portion 44 is provided closer to the second mesa portion 62 than the center of the gate trench portion 40 refers to that, in FIG. 5a, a d-d' dashed line which goes through the bottom portion end B2 of the gate conductive portion 44 is positioned closer to the second mesa portion 62 than a c-c' dashed line which goes through the center of the gate conductive portion 44 in Y-axis direction and the bottom portion end B1 of the gate trench portion 40. The bottom portion end B2 of the gate conductive portion 44 being provided closer to the second mesa portion 62 allows the p-type inversion layer generated on the bottom portion of the gate trench portion 40 to be generated more on the second mesa portion 62 side than on the first mesa portion 60 side. This can prevent and reduce, in the first mesa portion 60, the turn-on loss which is generated by the holes being extracted from the p-type inversion layer to the emitter region 12.

Figure 5B:
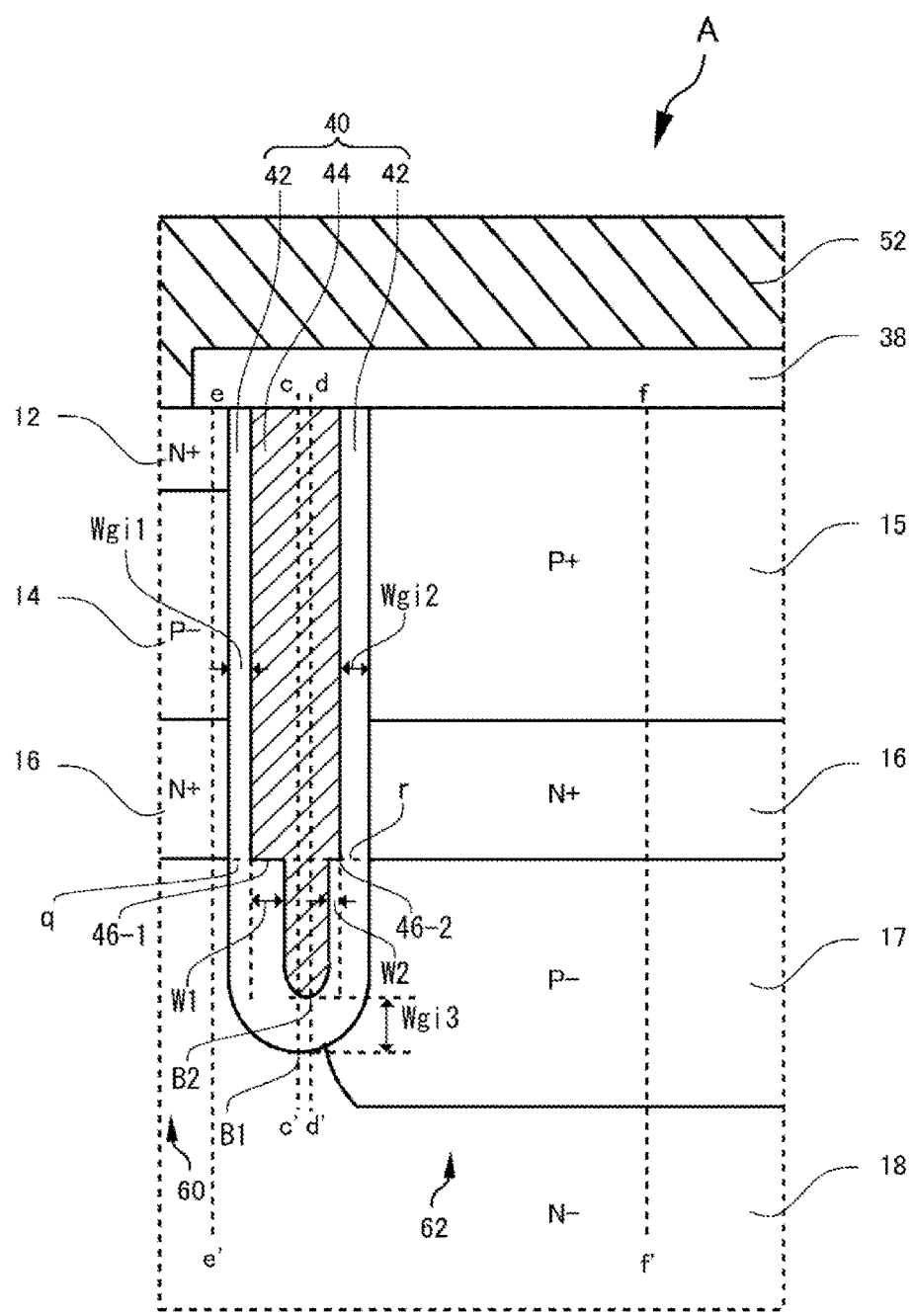

FIG. 5b illustrates an example with a second step 46-2 provided in FIG. 5a. As shown in FIG. 5b, the bottom portion of the gate conductive portion 44 has, in addition to the first step 46-1, a second step 46-2 on the side facing the second mesa portion 62. The second step 46-2 is provided, in Y-axis direction, in a direction from the surface of the gate conductive portion 44 toward the inside thereof. As shown in FIG. 5b, the width W2 of the second step 46-2 is a distance from the surface of the gate conductive portion 44 above the second step 46-2 to the surface of the gate conductive portion 44 below the second step 46-2. In the present example, W1 may be greater than W2. Making W1 greater than W2 allows the p-type inversion layer generated on the bottom portion of the gate trench portion 40 to be generated more on the second mesa portion 62 side than on the first mesa portion 60 side. This can prevent and reduce, in the first mesa portion 60, the turn-on loss which is generated by the holes being extracted from the p-type inversion layer to the emitter region 12.

As shown by the dashed line q and a dashed line r in FIG. 5b, the second step 46-2 may be provided at approximately the same depth as that of the first step 46-1. Also, as shown by the dashed line r in FIG. 5b, the second step 46-2 may be provided at approximately the same depth as that of the lower surface of the accumulation region 16 in the second mesa portion 62. The first step 46-1 and the second step 46-2 being provided at approximately the same height as that of the lower surface of the accumulation region 16 can prevent and reduce generation of the p-type inversion layer of the bottom portion of the gate trench portion 40 in the accumulation region 16.

The bottom portion end B2 of the gate conductive portion 44, like that in FIG. 5a, may be provided, in Y-axis direction, closer to the second mesa portion 62 than the center of the gate trench portion 40. The bottom portion end B2 of the gate conductive portion 44 being provided closer to the second mesa portion 62 allows the p-type inversion layer generated on the bottom portion of the gate trench portion 40 to be generated more on the second mesa portion 62 side than on the first mesa portion 60 side. This can prevent and reduce, in the first mesa portion 60, the turn-on loss which is generated by the holes being extracted from the p-type inversion layer to the emitter region 12.

Figure 5C:
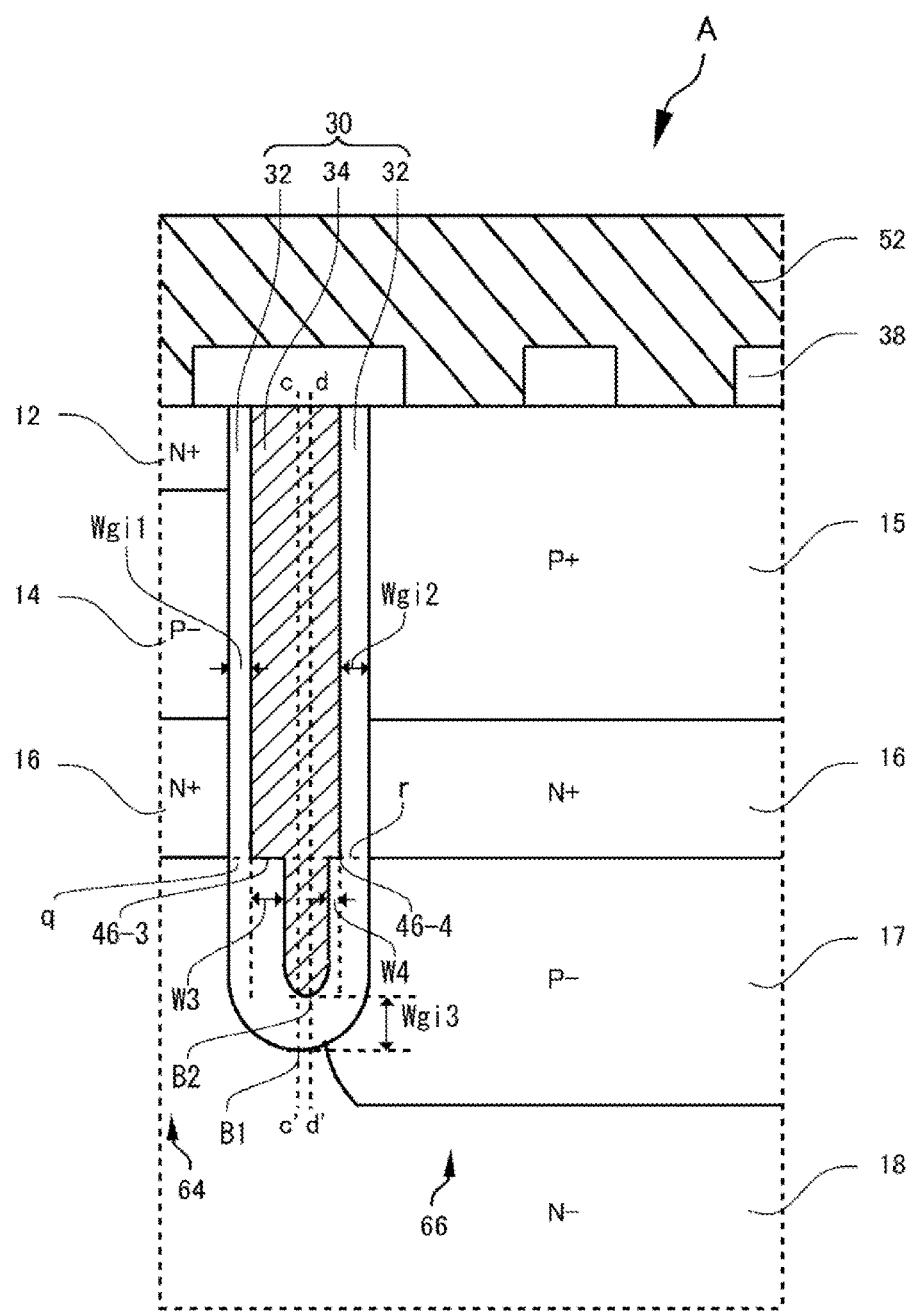
FIG. 5c is an enlarged view of a region S in FIG. 1b.

FIG. 5c is an enlarged view of the region S in FIG. 1b. As shown in FIG. 5c, like in FIG. 5a and FIG. 5b, a step may be provided in the dummy conductive portion 34 also in the dummy trench portion 30 of the diode portion 80. Among the dummy trench portions 30 in the diode portions 80, in the dummy trench portions 30 in direct contact with the boundary mesa portions 64 shown in FIG. 1b, FIG. 2b and FIG. 3b, a third step 46-3 may be provided on the side facing the boundary mesa portions 64, the third step 46-3 having approximately the same depth as that of the first step 46-1 and the same width as the width W1 of the first step 46-1.

Among the dummy trench portions 30 in the diode portions 80, in the dummy trench portions 30 in direct contact with the boundary mesa portions 64 shown in FIG. 1b, FIG. 2b and FIG. 3b, a fourth step 46-4 may be provided on the side facing diode mesa portion 66 as shown in FIG. 5c, the fourth step 46-4 having approximately the same depth as that of the second step 46-2 and the same width as the width W2 of the second step 46-2.

Among the dummy trench portions 30 in the diode portions 80, in the other dummy trench portion 30 connected to the one dummy trench portion 30 that is in direct contact with the boundary mesa portions 64 at a connecting portion 31 shown in FIG. 1b, FIG. 2b and FIG. 3b, a third step 46-3 may be provided on the opposite side, in Y-axis direction, of a side that faces the diode mesa portion 66, the third step 46-3 having approximately the same depth as that of the first step 46-1 and the same width as the width W1 of the first step 46-1.

Among the dummy trench portions 30 in the diode portions 80, in the other dummy trench portion 30 connected to the one dummy trench portion 30 that is in direct contact with the boundary mesa portions 64 at a connecting portion 31 shown in FIG. 1b, FIG. 2b and FIG. 3b, a fourth step 46-4 may be provided on the side facing the diode mesa portion 66, the forth step 46-4 having approximately the same depth as that of the second step 46-2 and the same width as the width W2 of the second step 46-2. As shown in FIG. 5c, at least part of the intermediate region 17 may be provided between the third step 46-3 and the bottom portion of the dummy trench portion 30.

Figure 5D:
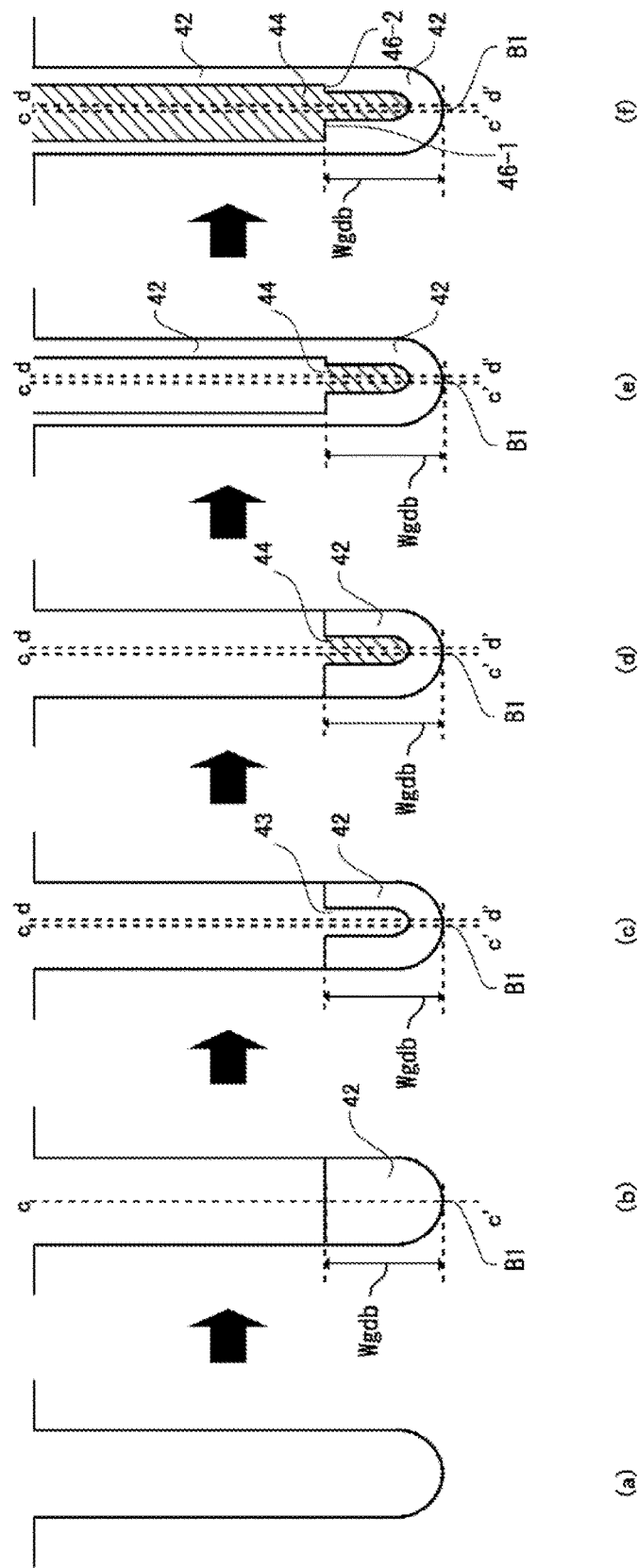
FIG. 5d illustrates an exemplary manufacturing method of a gate conductive portion 44 having the first step 46-1 and the second step 46-2.

FIG. 5d illustrates an exemplary manufacturing method of the gate conductive portion 44 having the first step 46-1 and the second step 46-2. In process (a), forming the gate trench. Next, in process (b), depositing the gate-insulating film 42 from the bottom portion end B1 of the gate trench to the height of Wgdb. Next, in process (c), forming a hole portion 43 with the d-d' dashed line as its center in the gate-insulating film 42. Next, in process (d), filling conductive material such as polysilicon into the hole portion 43 as the gate conductive portion 44. Next, in process (e), forming the gate-insulating film 42 by oxidizing or nitriding the inner wall of the gate trench above the gate-insulating film 42. Then, in process (d), filling conductive material such as polysilicon into the gate trench as the gate conductive portion 44. As described above, the first step 46-1 and the second step 46-2 are formed.

Figure 6:
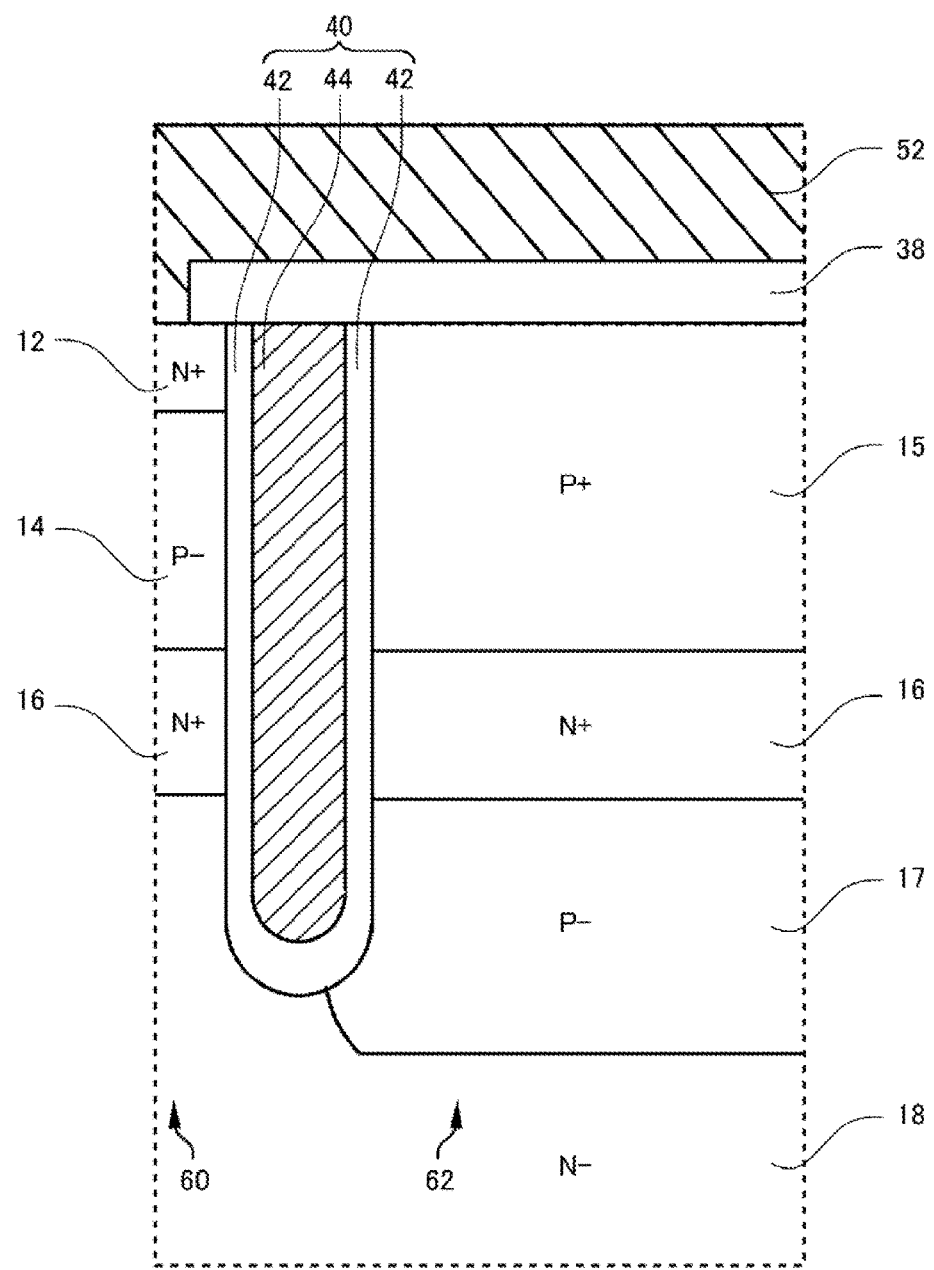
FIG. 6 illustrates a comparative example without having the first step 46-1 and the second step 46-2 in the example shown in FIG. 5b.
Figure 6:
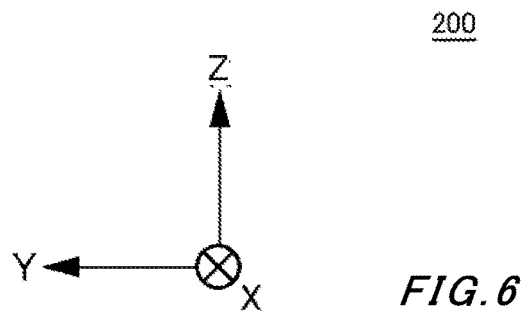

FIG. 6 illustrates a comparative example where, as compared with the example in FIG. 5b, the first step 46-1 and the second step 46-2 are eliminated and the gate conductive portion 44 is provided at the center of the gate trench in Y-axis direction. The semiconductor device 200 in the comparative example does not have any step in the bottom portion of the gate trench portion 40, and thus the p-type inversion layer is easy to be generated in the bottom portion of the gate trench portion 40. Also, since the gate conductive portion 44 is provided at the center in Y-axis direction of the gate trench, capacity between the collector electrode 24 and the gate trench portion 40 in the second mesa portion 62 can not be made smaller than capacity between the collector electrode 24 and the gate trench portion 40 in the first mesa portion 60. Thus, the turn-on loss is greater than that of the semiconductor device 100 in FIG. 5b.

Figure 7:
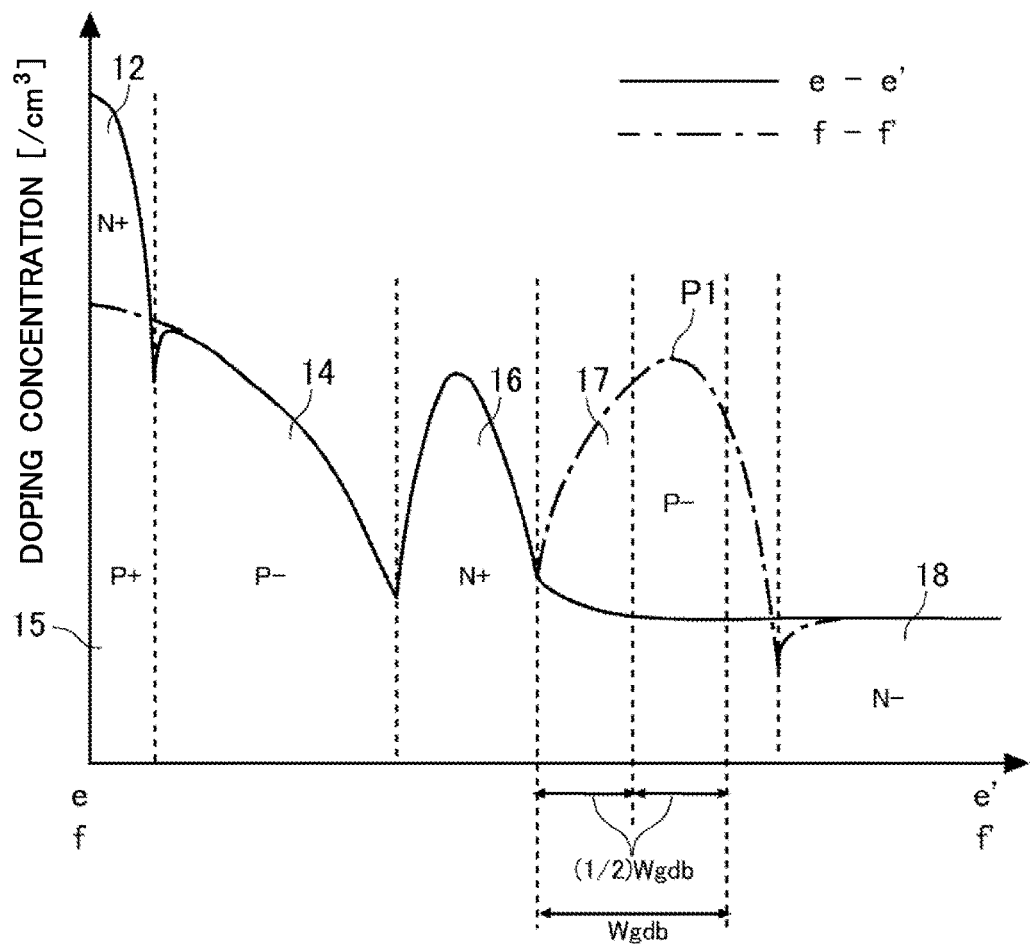

FIG. 7 illustrates an exemplary profile of doping concentration on an e-e' cross-section and an f-f' cross-section in FIG. 5a. As can be seen from FIG. 7, the profile on the e-e' cross-section of the first mesa portion 60 does not have any peak of the doping concentration at the same depth as that of the intermediate region 17 of the second mesa portion 62. The profile on f-f' cross-section of the second mesa portion 62 has a peak (P1) of the doping concentration in the intermediate region 17. Having the peak (P1) of the doping concentration in the intermediate region 17 of the second mesa portion 62 can make the withstand voltage of the transistor portion 70 high. Note that, FIG. 7 shows an example where the second mesa portion 62 has the accumulation region 16, but the second mesa portion 62 may not have the accumulation region 16.

As shown in FIG. 7, the peak of the intermediate region 17 may exist, in Z-axis direction in FIG. 5b, within an area from the first step 46-1 and the second step 46-2 to the bottom portion end B1 of the gate trench portion 40. The peak of the intermediate region 17 existing within an area from the first step 46-1 and the second step 46-2 to the bottom portion of the gate trench portion 40 can make the withstand voltage of the transistor portion 70 high.

As shown in FIG. 7, the peak of the intermediate region 17 may exist, in Z-axis direction, below half the depth Wgdb, which is a depth from the first step 46-1 and the second step 46-2 to the bottom portion end B1 of the gate trench portion 40. The peak of the intermediate region 17 existing below half the depth Wgdb, which is the depth from the first step 46-1 and the second step 46-2 to the end of the bottom portion of the gate trench portion 40 can make the withstand voltage of the transistor portion 70 higher.

Figure 8A:
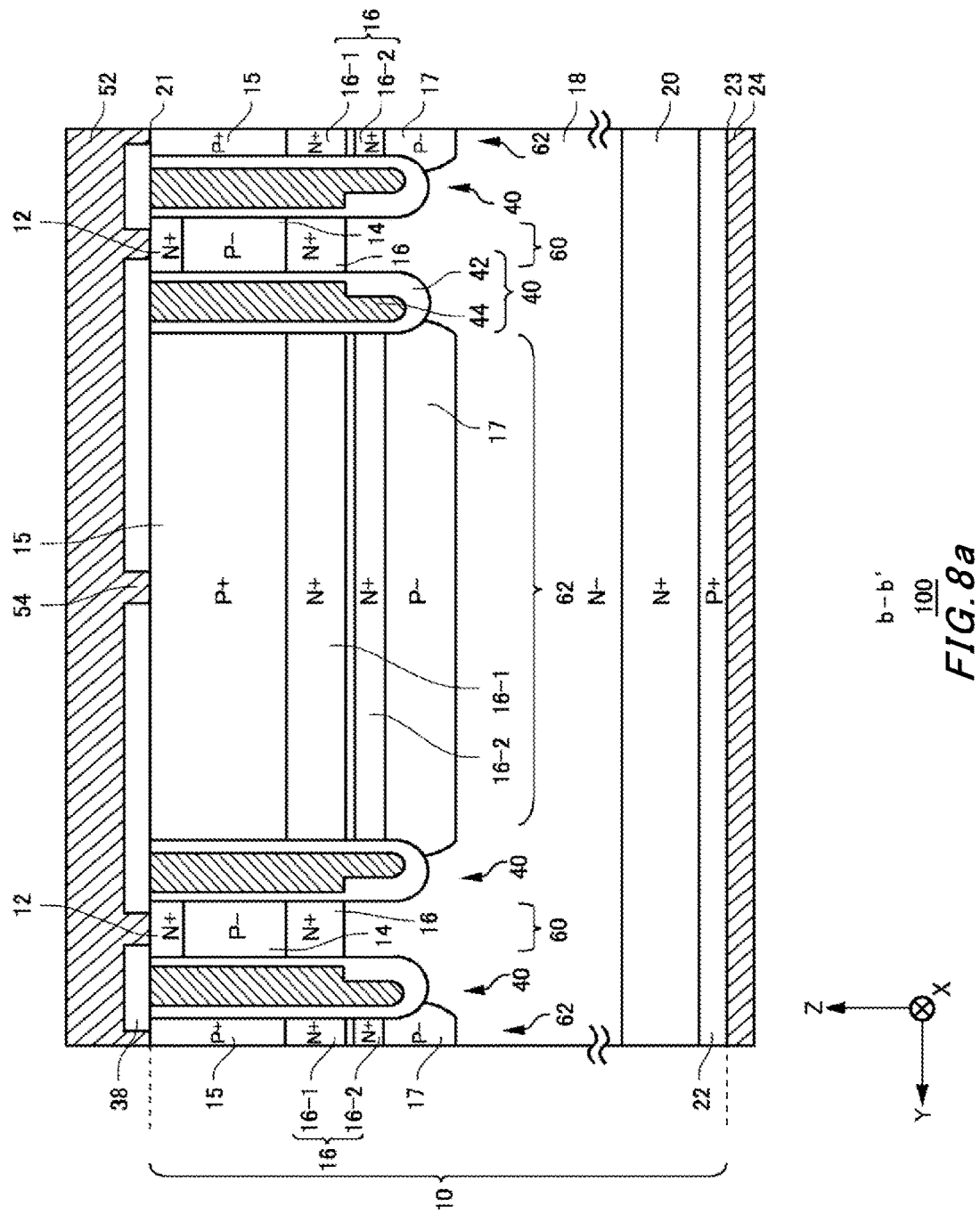

FIG. 8a illustrates still another exemplary b-b' cross-section in FIG. 1a. The semiconductor device 100 in FIG. 8a is different from the semiconductor device 100 in FIG. 4a in a point where the accumulation region 16 of the second mesa portion 62 has the first accumulation region 16-1 and the second accumulation region 16-2. The second accumulation region 16-2 may be provided below the first accumulation region 16-1 and above the intermediate region 17. The thickness of the first accumulation region 16-1 in Z-axis direction may be the same as or different from that of the second accumulation region 16-2 in Z-axis direction. FIG. 8a shows an example where the thickness of the first accumulation region 16-1 in Z-axis direction is greater than the thickness of the second accumulation region 16-2. The semiconductor device 100 in the present example can, by the accumulation region 16 having the first accumulation region 16-1 and the second accumulation region 16-2 in the second mesa portion 62, prevent and reduce the holes passing through from the lower surface 23 side to the upper surface 21 side more than the semiconductor device 100 in FIG. 4a.

Figure 8B:
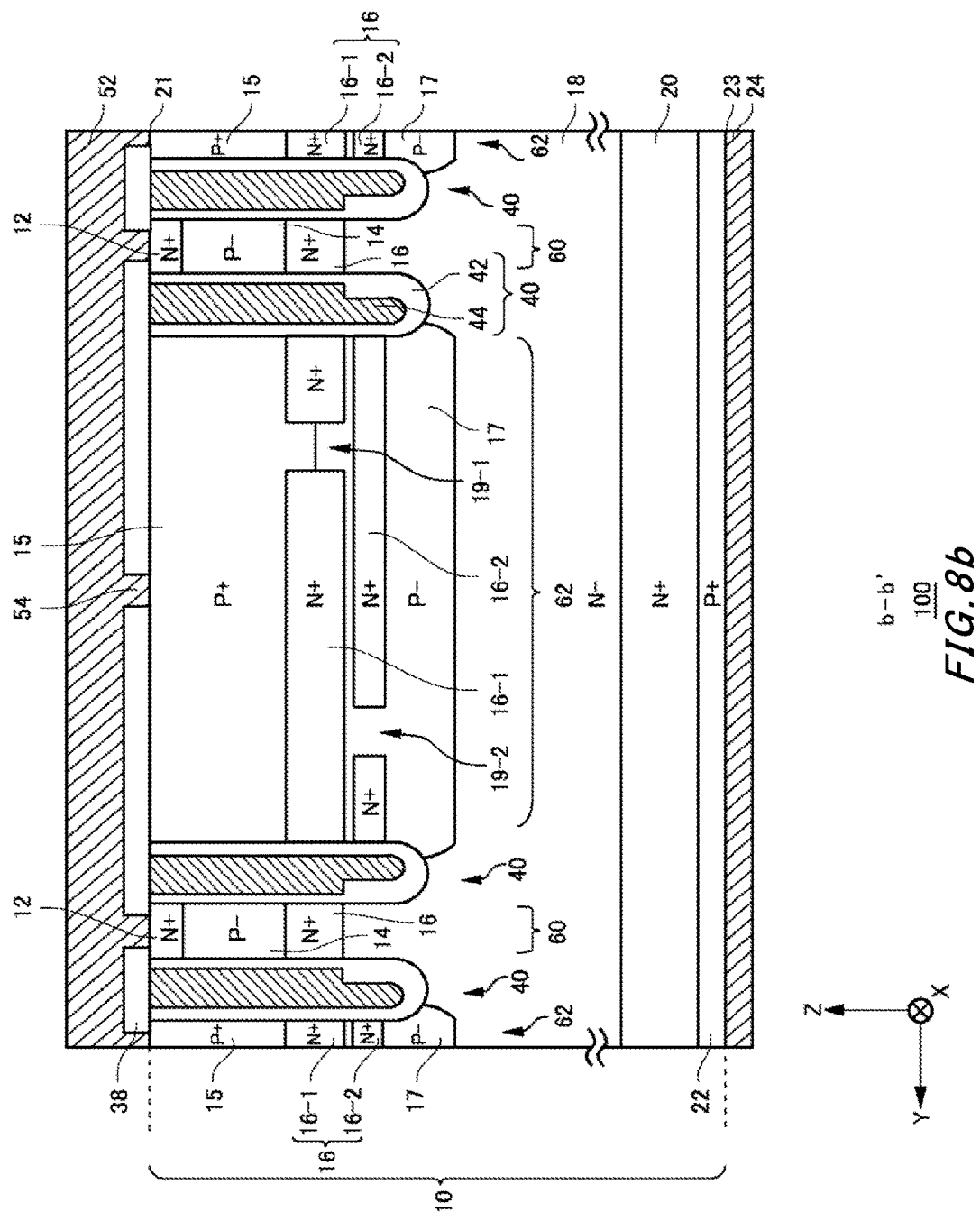

FIG. 8b illustrates still another exemplary b-b' cross-section in FIG. 1a. The semiconductor device 100 in FIG. 8b is different from the semiconductor device 100 in FIG. 8a in a point where the first accumulation region 16-1 has the first opening 19-1 and the second accumulation region 16-2 has the second opening 19-2. As shown in FIG. 8b, the first opening 19-1 and the second opening 19-2 are provided at different positions in Y-axis direction. The first accumulation regions 16-1 and the second accumulation regions 16-2 may be provided contacting with or apart from the gate trench portion 40. Also, a plurality of openings 19-1 and a plurality of openings 19-2 may be provided in the first accumulation region 16-1 and the second accumulation region 16-2, respectively. FIG. 8b shows an example where the first accumulation region 16-1 and the second accumulation region 16-2 are provided contacting with the gate trench portions 40 and have one first opening 19-1 and one second opening 19-2, respectively. The positions being different between the first opening 19-1 and the second opening 19-2 in Y-axis direction cause the holes moving from the lower surface 23 side to the upper surface 21 side to pass through the accumulation region 16 inevitably. This can prevent and reduce the holes passing through from the lower surface 23 side to the upper surface 21 side. Also, the first opening 19-1 and the second opening 19-2 being provided causes the contact hole 54 to expand from the depletion layer. Thus, the withstand voltage of the transistor portion 70 can be made high.

FIG. 8c illustrates still another exemplary b-b' cross-section in FIG. 1a. The semiconductor device 100 in FIG. 8c is different from the semiconductor device 100 in FIG. 8a in a point where the first mesa portion 60 has the accumulation region 16-1 and the accumulation region 16-2 in the depth direction, and the second mesa portion 62 has the accumulation region 16-1, accumulation region 16-2 and the accumulation region 16-3. That is, two accumulation regions are provided in the first mesa portion 60 and three accumulation regions are provided in the second mesa portion 62. The second mesa portion 62 having the accumulation region 16-3 more than the first mesa portion 60 allows the second mesa portion 62, more than the first mesa portion 60, to prevent and reduce the holes passing through from the lower surface 23 side to the upper surface 21 side. This can prevent and reduce, in the first mesa portion 60, the turn-on loss which is generated by the holes being extracted to the emitter region 12.

The number of the accumulation regions 16 has to satisfy the relationship of N<M, where N refers to the accumulation region 16 of the first mesa portion 60; M refers to the accumulation region 16 of the second mesa portion 62. FIG. 8c shows an example, where N=2 and M=3.

Figure 9:
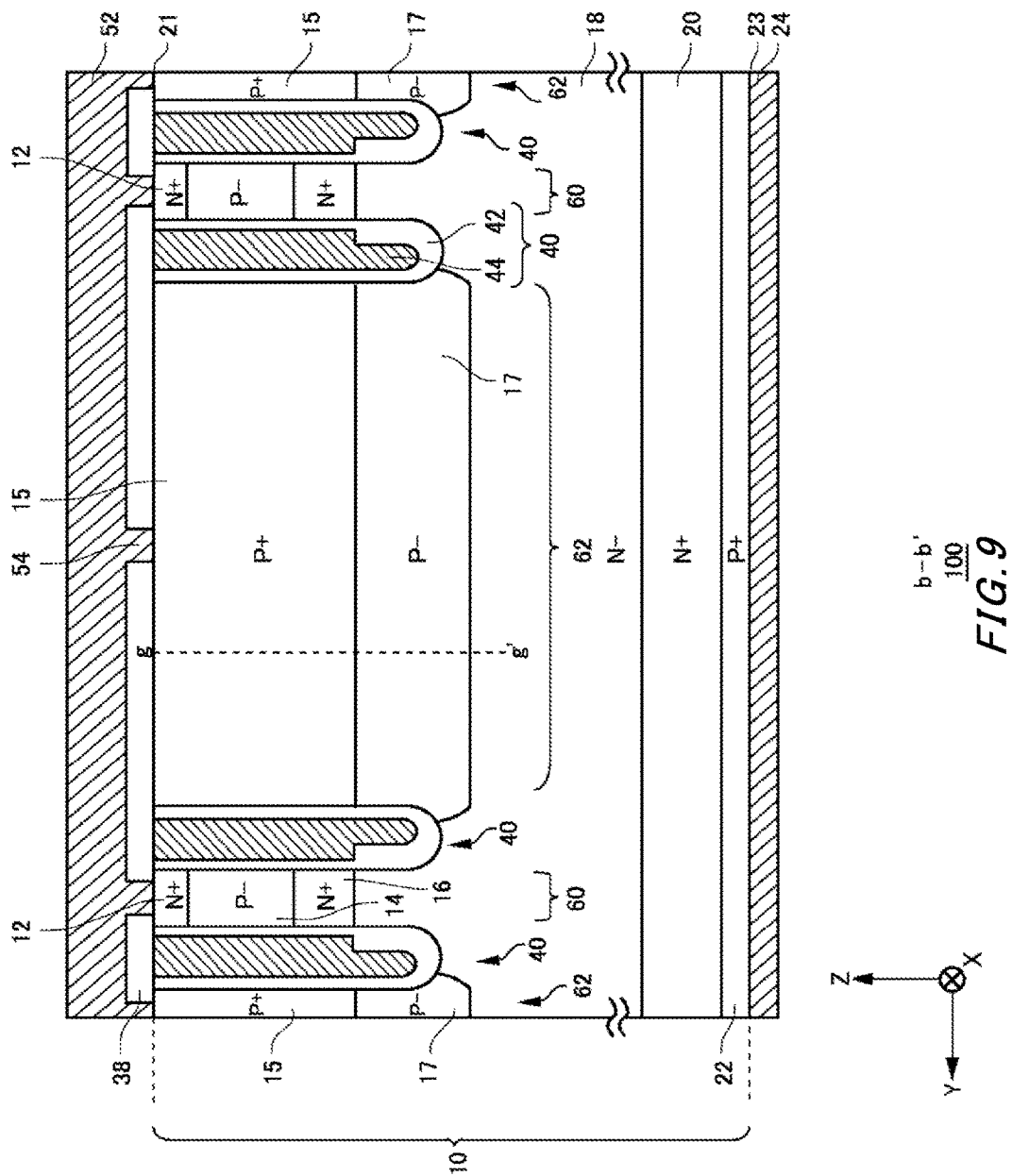

FIG. 9 illustrates still another exemplary b-b' cross-section in FIG. 1a. The semiconductor device 100 in FIG. 9 is different from the semiconductor device 100 in FIG. 4a in a point where the intermediate region 17 is provided below the contact region 15 and contacting with the contact region 15. Also, the semiconductor device 100 in FIG. 9 is different from the semiconductor device 100 in FIG. 4a in a point where the accumulation region 16 is not provided in the second mesa portion 62.

Figure 10:
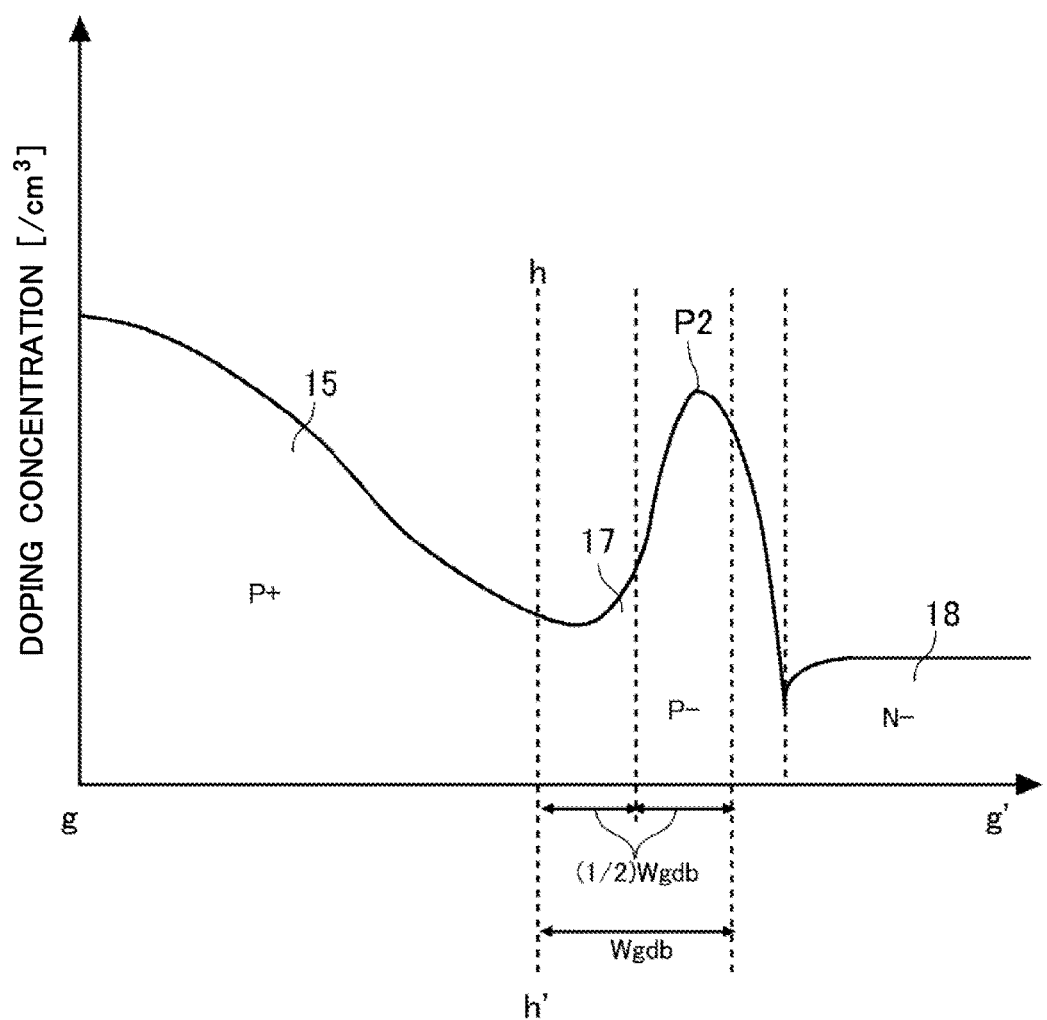
FIG. 10 illustrates an exemplary profile of doping concentration on the g-g' cross-section in FIG. 9.

FIG. 10 illustrates an exemplary profile of doping concentration on the g-g' cross-section in FIG. 9. As shown in FIG. 10, the profile on the g-g' cross-section of the second mesa portion 62 has the doping concentration that changes continuously across a region from the contact region 15 to the intermediate region 17. The doping concentration being continuously changed refers to that the doping concentration changes smoothly across a region from the contact region 15 to the intermediate region 17 in the boundary between the contact region 15 and the intermediate region 17 that is indicated by a h-h' line in FIG. 10. FIG. 10 shows an example where the doping concentration of the contact region 15 monotonously is reduced in depth direction, but the peak of the doping concentration may be within the contact region 15.

The intermediate region 17 may have a peak (P2) of the doping concentration, like the example in FIG. 7. Also, the peak (P2) of the intermediate region 17 may exist, in Z-axis direction, within an area from the first step 46-1 and the second step 46-2 to the bottom portion end B1 of the gate trench portion 40. Also, the peak of the intermediate region 17 may exist, in Z-axis direction, below half the depth Wgdb, which is the depth from the first step 46-1 and the second step 46-2 to the bottom portion end B1 of the gate trench portion 40. In the present example, since the second mesa portion 62 is formed in the contact region 15 of the second conductivity type and the intermediate region 17, the depletion layer is expanded from the contact hole 54 more than in the example in FIG. 4a. Thus, the withstand voltage of the transistor portion 70 can be made higher than that of the semiconductor device 100 in FIG. 4a. Note that, in addition, the intermediate region 17 may have a peak other than the peak (P2) shown in FIG. 10.

Figure 11:
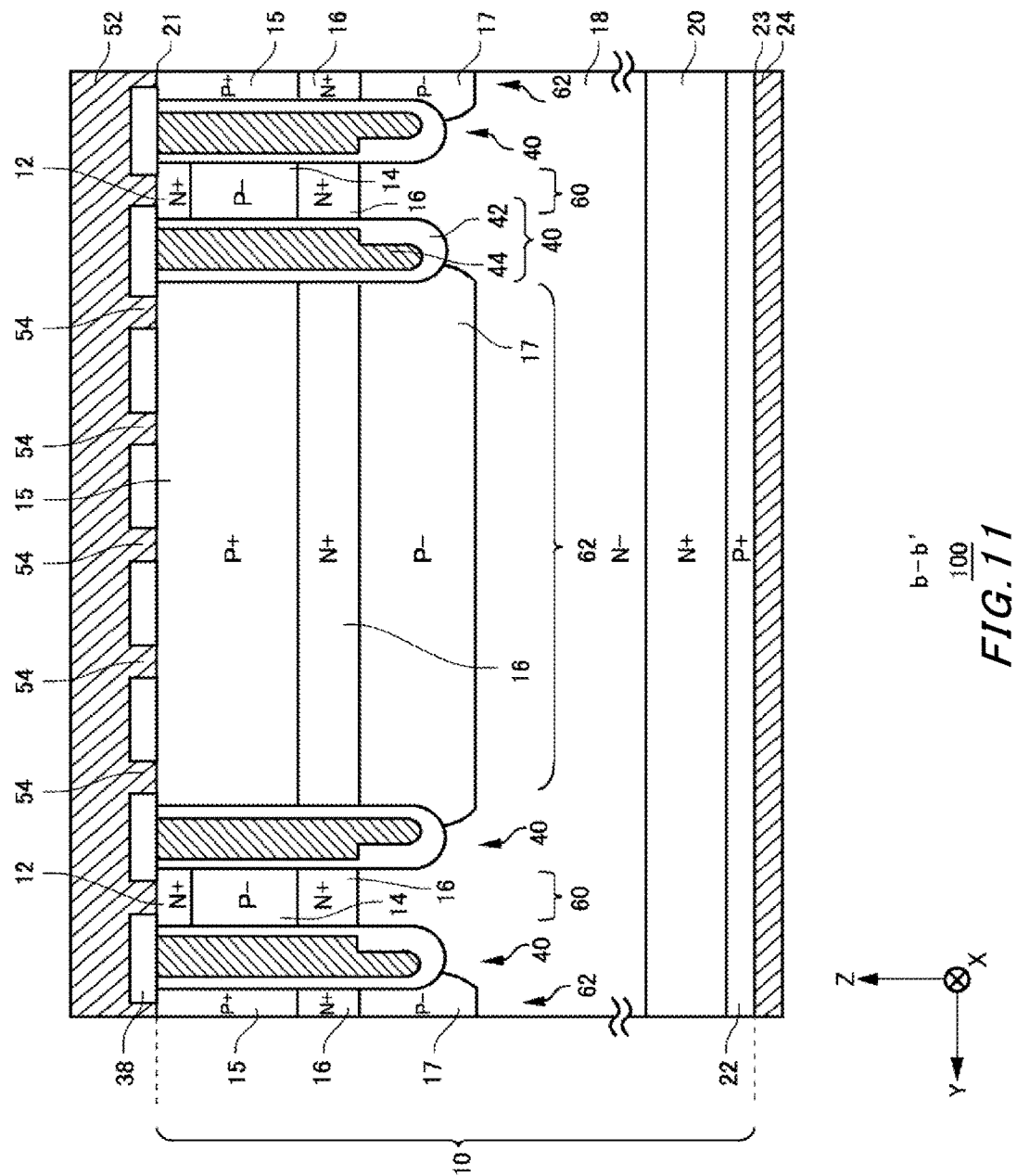

FIG. 11 illustrates still another exemplary b-b' cross-section in FIG. 1a. The semiconductor device 100 in FIG. 11 is different from the semiconductor device 100 in FIG. 4a in a point where a plurality of contact holes 54 are provided above the second mesa portion 62. The contact holes 54 are formed in the interlayer dielectric film 38. The plurality of contact holes 54 being provided in the second mesa portion 62 causes the depletion layer to expand from the contact holes 54 than the semiconductor device 100 in FIG. 4a. Thus, the withstand voltage of the transistor portion 70 can be made higher than that of the semiconductor device 100 in FIG. 4a.

Figure 12:
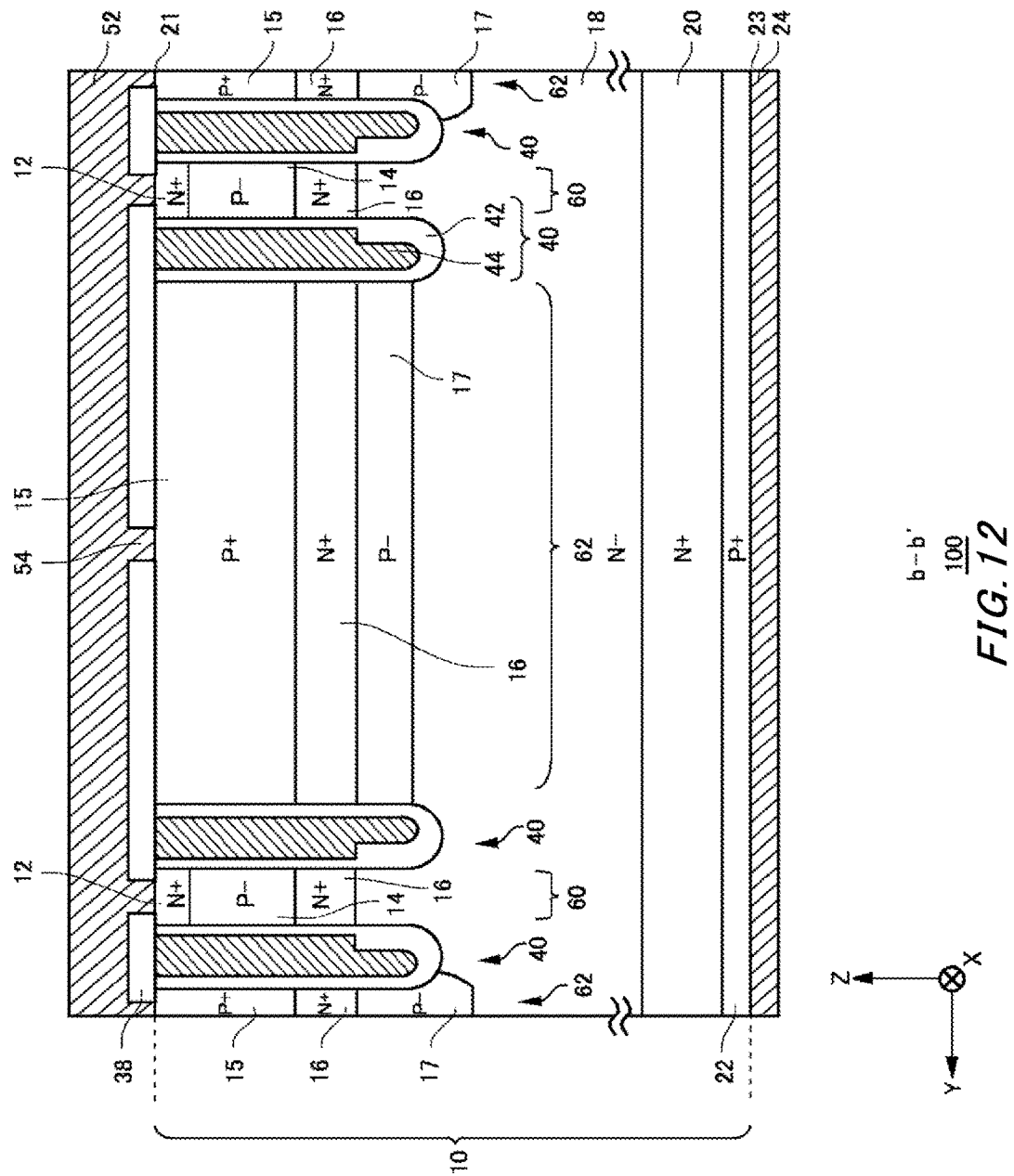

FIG. 12 illustrates still another exemplary b-b' cross-section in FIG. 1a. The semiconductor device 100 in FIG. 12 is different from the semiconductor device 100 in FIG. 4a in a point where the intermediate region 17 is not formed down to the bottom portion of the gate trench portion 40. In the present example, the intermediate region 17 is formed only on a side surface (XZ-plane) of the gate trench portion 40. In the present example, since the intermediate region 17 is formed shallower than that of the semiconductor device 100 in FIG. 4a, the withstand voltage of the transistor portion 70 as high as that of the semiconductor device 100 in FIG. 4a can not be obtained. However, as compared with a case where the intermediate region 17 is not provided below the accumulation region 16 of the second mesa portion 62, the withstand voltage of the transistor portion 70 can be more improved.

Figure 13:
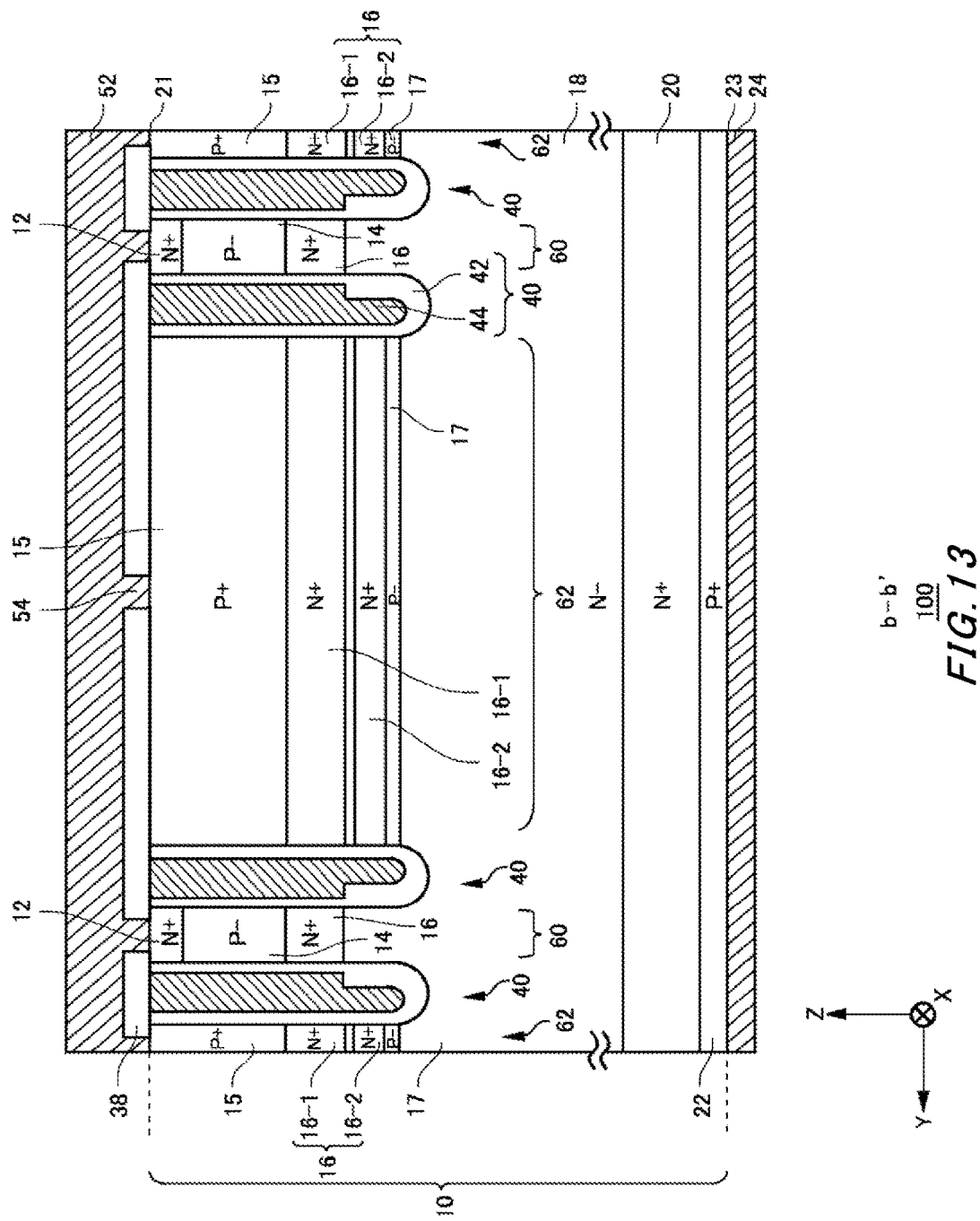

FIG. 13 illustrates still another exemplary b-b' cross-section in FIG. 1a. The semiconductor device 100 of FIG. 13 is different from the semiconductor device 100 in FIG. 8a in a point where the intermediate region 17 is not formed down to the bottom portion of the gate trench portion 40. In the present example, the intermediate region 17 is formed only on the side surface (XZ-plane) of the gate trench portion 40. In the present example, since the intermediate region 17 is provided shallower than that of the semiconductor device 100 in FIG. 8a, the withstand voltage of the transistor portion 70 as high as that of the semiconductor device 100 in FIG. 8a can not be obtained. However, as compared with a case where the intermediate region 17 is not provided below the accumulation region 16 of the second mesa portion 62, the withstand voltage of the transistor portion 70 can be more improved.

Figure 14:
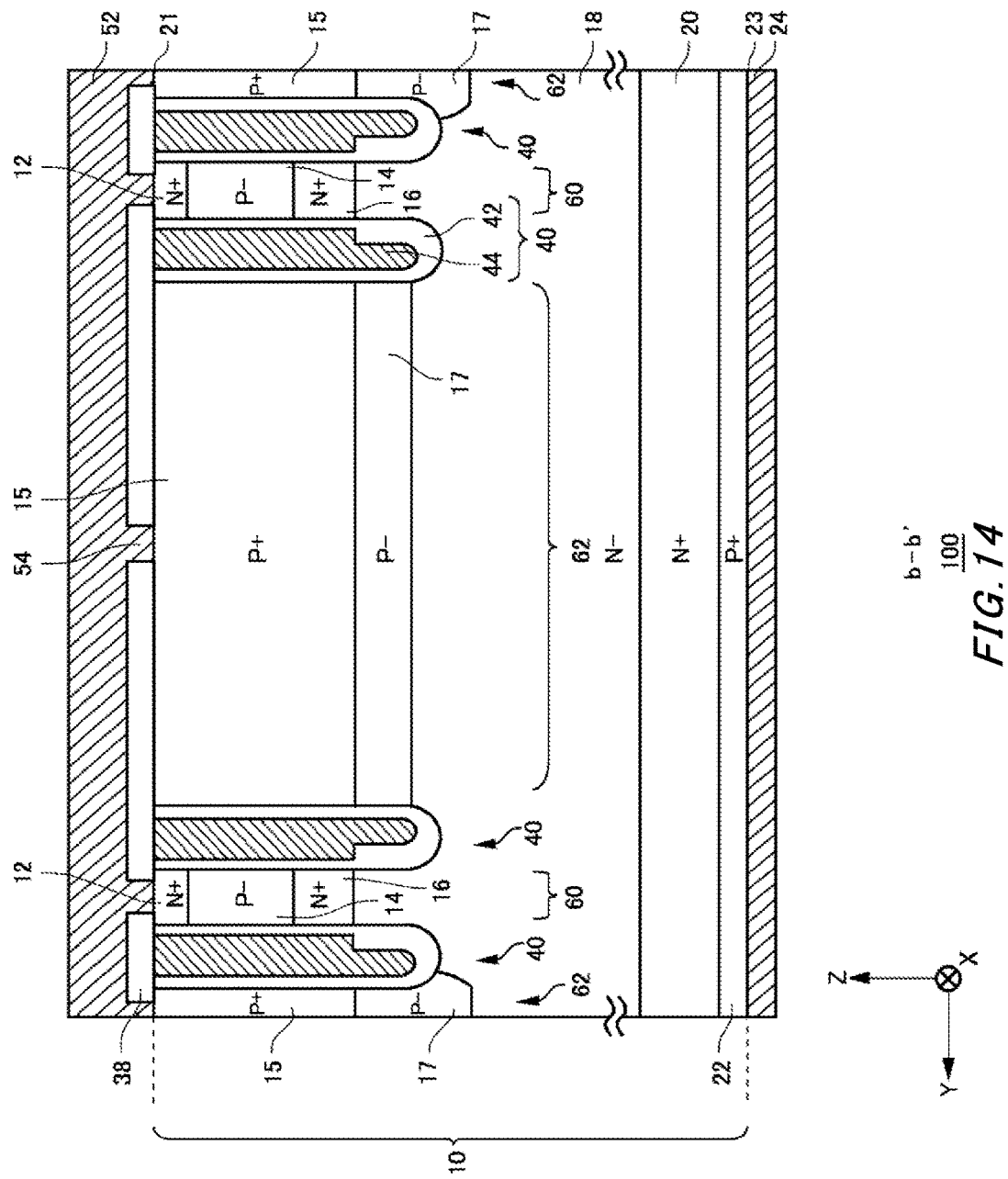

FIG. 14 illustrates still another exemplary b-b' cross-section in FIG. 1a. The semiconductor device 100 in FIG. 14 is different from the semiconductor device 100 in FIG. 9 in a point where the intermediate region 17 is not formed down to the bottom portion of the gate trench portion 40. In the present example, the intermediate region 17 is formed only on the side surface (XZ-plane) of the gate trench portion 40. In the present example, since the intermediate region 17 is provided shallower than that of the semiconductor device 100 in FIG. 9, the withstand voltage of the transistor portion 70 as high as that of the semiconductor device 100 in FIG. 9 can not be obtained. However, as compared with a case where the intermediate region 17 is not provided below the accumulation region 16 of the second mesa portion 62, the withstand voltage of the transistor portion 70 can be more improved.

Figure 15:
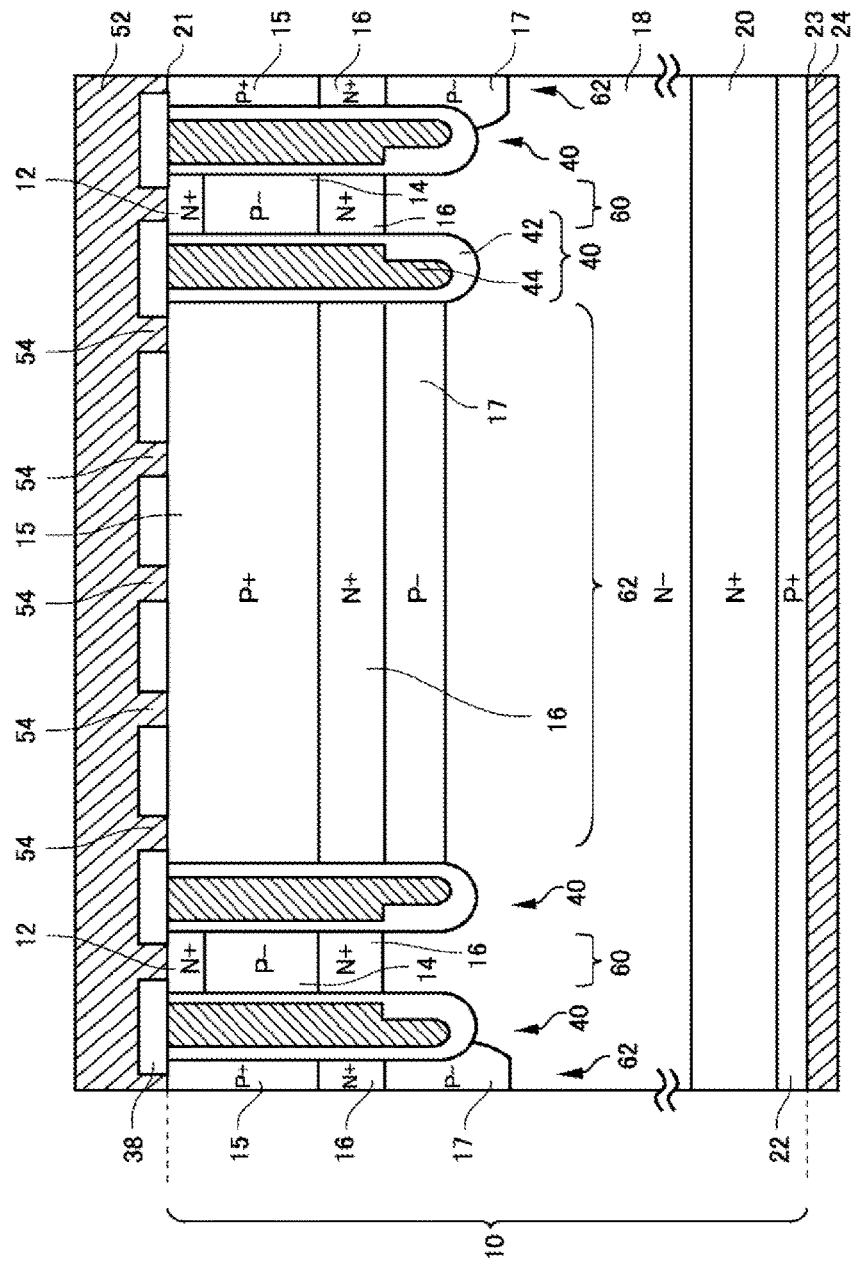

FIG. 15 illustrates still another exemplary b-b' cross-section in FIG. 1a. The semiconductor device 100 in FIG. 15 is different from the semiconductor device 100 in FIG. 11 in a point where the intermediate region 17 is not formed down to the bottom portion of the gate trench portion 40. In the present example, the intermediate region 17 is formed only on the side surface (XZ-plane) of the gate trench portion 40. In the present example, since the intermediate region 17 is provided shallower than that of the semiconductor device 100 in FIG. 11, the withstand voltage of the transistor portion 70 as high as that of the semiconductor device 100 in FIG. 11 can not be obtained. However, as compared with a case where the intermediate region 17 is not provided below the accumulation region 16 of the second mesa portion 62, the withstand voltage of the transistor portion 70 can be more improved.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a semiconductor substrate having a drift region of first conductivity type;
   a gate trench portion which is provided from an upper surface of the semiconductor substrate to the drift region and arranged extending in a predetermined extending direction;
   a first mesa portion which is provided in direct contact with the gate trench portion in the semiconductor substrate in one of directions perpendicular to the extending direction;
   a second mesa portion which is provided in direct contact with the gate trench portion in the opposite side of said one of directions;
   an accumulation region of first conductivity type which is provided in direct contact with the gate trench portion and above the drift region in the first mesa portion and has higher doping concentration than doping concentration of the drift region;
   a base region of second conductivity type which is provided in direct contact with the gate trench portion and above the accumulation region in the first mesa portion;

an emitter region of first conductivity type which is provided in direct contact with the gate trench portion and between the base region and the upper surface of the semiconductor substrate in the first mesa portion and has higher doping concentration than doping concentration of the drift region;

an intermediate region of second conductivity type which is provided in direct contact with the gate trench portion and above the drift region in the second mesa portion; and a contact region of second conductivity type which is provided in direct contact with the gate trench portion and above the intermediate region on an upper surface of the second mesa portion, wherein the gate trench portion has a gate trench, a gate-insulating film formed covering an inner wall of the gate trench, and a gate conductive portion formed, inside the gate trench, more inward than the gate-insulating film, a bottom portion of the gate conductive portion has a first step on a side facing the first mesa portion;

the bottom portion of the gate conductive portion has, on a side facing the second mesa portion, a second step which has a smaller width than a width of the first step in the perpendicular direction to the extending direction, or does not have a second step, and at least part of the intermediate region is provided, in a depth direction of the semiconductor substrate, between the first step and a bottom portion of the gate trench portion.

2. The semiconductor device according to claim 1, wherein an end of the bottom portion of the gate conductive portion is provided closer to the second mesa portion than a center of the gate trench portion in the perpendicular direction to the extending direction.

3. The semiconductor device according to claim 1, wherein, above the first step, a thickness of the gate-insulating film on a side facing the first mesa portion is different from a thickness of the gate-insulating film on a side facing the second mesa portion.

4. The semiconductor device according to claim 3, wherein a thickness of the gate-insulating film on the side facing the second mesa portion is greater than a thickness of the gate-insulating film on a side facing the first mesa portion.

5. The semiconductor device according to claim 1, wherein the intermediate region covers at least part of a bottom portion of the gate trench portion.

6. The semiconductor device according to claim 1, wherein, in the second mesa portion, an accumulation region of first conductivity type having higher doping concentration than doping concentration of the drift region is provided above the intermediate region and below the contact region.

7. The semiconductor device according to claim 6, wherein, in the second mesa portion, the accumulation region is provided contacting with the gate trench portion.

8. The semiconductor device according to claim 6, wherein, in the second mesa portion, the accumulation region is provided spaced apart from the gate trench portion.

9. The semiconductor device according to claim 7, wherein, in the second mesa portion, an opening is provided in the accumulation region.

10. The semiconductor device according to claim 6, wherein, in the second mesa portion, the accumulation region has:
a first accumulation region; and
a second accumulation region provided below the first accumulation region and above the intermediate region.

11. The semiconductor device according to claim 10, wherein, in the second mesa portion,
the first accumulation region has a first opening,
the second accumulation region has a second opening, and
a position of the first opening and a position of the second opening are different in the perpendicular direction to the extending direction.

12. The semiconductor device according to claim 6, wherein the accumulation region has, in the first mesa portion, N accumulation regions in the depth direction,
the accumulation region has, in the second mesa portion, M accumulation regions in the depth direction, and
N and M satisfy a relationship: N<M.

13. The semiconductor device according to claim 1, wherein the intermediate region is provided contacting with the contact region below the contact region, and doping concentration continuously changes across a region from the contact region to the intermediate region.

14. The semiconductor device according to claim 1, wherein the intermediate region has a peak of doping concentration in the depth direction.

15. The semiconductor device according to claim 14, wherein the peak of the intermediate region exists, in the depth direction, within an area from the first step to an end of the bottom portion of the gate trench portion.

16. The semiconductor device according to claim 14, wherein the peak of the intermediate region exists, in the depth direction, more below than half a depth from the first step to an end of the bottom portion of the gate trench portion.

17. The semiconductor device according to claim 1, wherein a plurality of the gate trench portions are provided next to each other with the second mesa portion therebetween, and
a dummy trench portion is not provided between a plurality of the gate trench portions that are next to each other.

18. The semiconductor device according to claim 1, wherein a width of the second mesa portion in the perpendicular direction to the extending direction is greater than a width of the first mesa portion in the perpendicular direction to the extending direction.

19. The semiconductor device according to claim 18, wherein the width of the first mesa portion is smaller than a depth from an upper surface of the semiconductor substrate to an end of a bottom portion of the gate trench portion.

20. The semiconductor device according to claim 1 further comprising an interlayer dielectric film which is formed on an upper surface of the semiconductor substrate, wherein the interlayer dielectric film has contact holes, and a plurality of the contact holes are provided above the second mesa portion.

21. The semiconductor device according to claim 1, wherein doping concentration of the contact region and the intermediate region is higher than doping concentration of the base region.

22. The semiconductor device according to claim 1, wherein doping concentration of the contact region is equal to doping concentration of the base region.

23. A semiconductor device comprising:
a semiconductor substrate having a drift region of first conductivity type;
a dummy trench portion which is provided from an upper surface of the semiconductor substrate to the drift region and arranged extending in a predetermined extending direction;
a diode mesa portion provided in direct contact with the dummy trench portion in the semiconductor substrate perpendicular to the extending direction;
an accumulation region of first conductivity type which is provided in direct contact with the dummy trench portion and above the drift region in the diode mesa portion and has higher doping concentration than doping concentration of the drift region;
a base region of second conductivity type provided in direct contact with the dummy trench portion and above the accumulation region in the diode mesa portion;
an emitter region of first conductivity type provided between the base region and an upper surface of the semiconductor substrate in the diode mesa portion and has higher doping concentration than doping concentration of the drift region;
a contact region of second conductivity type provided between the base region and an upper surface of the semiconductor substrate in the diode mesa portion; and
an intermediate region of second conductivity type provided adjacent to the dummy trench portion and above the drift region in the diode mesa portion.

24. The semiconductor device according to claim 23, wherein a boundary between the emitter region and the contact region is parallel to the extending direction.

25. The semiconductor device according to claim 23, wherein a boundary between the emitter region and the contact region is perpendicular to the extending direction.

26. The semiconductor device according to claim 23, wherein
the dummy trench portion has: a dummy trench;
a dummy insulating film which is formed covering an inner wall of the dummy trench; and
a dummy conductive portion which is formed more inward than the dummy insulating film inside the dummy trench,
a bottom portion of the dummy conductive portion has a third step on an opposite side to the diode mesa portion,
a bottom portion of the dummy conductive portion has, on a side facing the diode mesa portion, a fourth step which has a smaller width than a width of the third step in the perpendicular direction to the extending direction, or does not have a fourth step, and
at least part of the intermediate region, is provided, in a depth direction of the semiconductor substrate, between the third step and a bottom portion of the dummy trench portion.

* * * * *